(12) United States Patent
Jeong et al.

(10) Patent No.: US 11,730,016 B2
(45) Date of Patent: Aug. 15, 2023

(54) DISPLAY APPARATUS HAVING DRIVING CIRCUIT AND LIGHT EMITTING DEVICE

(71) Applicant: LG Display Co., Ltd., Seoul (KR)

(72) Inventors: Jae Kyu Jeong, Paju-si (KR); Hee Jung Yang, Goyang-si (KR); Keum Kyu Min, Paju-si (KR); Ara Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 176 days.

(21) Appl. No.: 17/244,681

(22) Filed: Apr. 29, 2021

(65) Prior Publication Data
US 2022/0165828 A1 May 26, 2022

(30) Foreign Application Priority Data
Nov. 24, 2020 (KR) .................. 10-2020-0158742

(51) Int. Cl.
| | |
|---|---|
| *H10K 59/126* | (2023.01) |
| *H10K 59/121* | (2023.01) |
| *H10K 59/38* | (2023.01) |
| *H10K 59/122* | (2023.01) |
| *H10K 59/123* | (2023.01) |
| *H10K 71/00* | (2023.01) |
| *H01L 27/12* | (2006.01) |
| *H10K 59/12* | (2023.01) |

(52) U.S. Cl.
CPC ....... *H10K 59/1216* (2023.02); *H10K 59/122* (2023.02); *H10K 59/123* (2023.02); *H10K 59/126* (2023.02); *H10K 59/1213* (2023.02); *H10K 59/38* (2023.02); *H10K 71/00* (2023.02); *H01L 27/1214* (2013.01); *H10K 59/1201* (2023.02)

(58) Field of Classification Search
CPC ............. H01L 27/3265; H01L 27/3246; H01L 27/3248; H01L 27/3262; H01L 27/3272; H01L 27/1214
USPC .......................................................... 257/71
See application file for complete search history.

(56) References Cited

U.S. PATENT DOCUMENTS

| | | | |
|---|---|---|---|
| 2013/0320314 A1* | 12/2013 | Kim ...................... | H01L 51/52 |
| | | | 257/40 |
| 2021/0126115 A1* | 4/2021 | Koezuka ........... | H01L 29/78618 |
| 2021/0234112 A1* | 7/2021 | Seo ........................ | H01L 51/502 |

FOREIGN PATENT DOCUMENTS

KR  10-2015-0113530 A  10/2015

\* cited by examiner

*Primary Examiner* — Xia L Cross
(74) *Attorney, Agent, or Firm* — Polsinelli PC

(57) ABSTRACT

A display apparatus comprising a driving circuit that includes a storage capacitor and at least one thin film transistor, and a light-emitting device that includes a region disposed outside the driving circuit and a region overlapping with the storage capacitor, each of capacitor electrodes of the storage capacitor being a transparent electrode having a relatively higher transmittance, so that the quality of the image realized on an outer surface of a device substrate which supports the driving circuit and the light-emitting device of each pixel area can be improved.

15 Claims, 18 Drawing Sheets

DISPLAY APPARATUS HAVING DRIVING CIRCUIT AND LIGHT EMITTING DEVICE

CROSS-REFERENCE TO RELATED APPLICATION

This application claims the benefit of Korean Patent Application No. 10-2020-0158742 filed on Nov. 24, 2020, which is hereby incorporated by reference in its entirety.

BACKGROUND

Field of the Disclosure

The present disclosure relates to a display apparatus in which a driving circuit and a light-emitting device are disposed in each pixel area.

Description of the Background

In general, an electronic appliance such as a monitor, a TV, a laptop computer, and a digital camera includes a display apparatus to realize an image. For example, the display apparatus may include pixel areas. Each of the pixel areas may display a specific color. For example, a driving circuit and a light-emitting device may be disposed in each pixel area.

The light-emitting device may be electrically connected to the driving circuit. The driving circuit may provide a driving current to the light-emitting device during one frame. For example, the driving circuit may include a storage capacitor and at least one thin film transistor.

The display apparatus may realize an image on an outer surface of a device substrate which supports the driving circuit and the light-emitting device of each pixel area. However, in the display apparatus, light emitted from the light-emitting device of each pixel area may be partially blocked by the driving circuit of the corresponding pixel area. Thus, in the display apparatus, the effective emission region of each pixel area may be reduced. Therefore, in the display apparatus, the quality of the image realized on the outer surface of the device substrate may be decreased.

SUMMARY

Accordingly, the present disclosure is directed to a display apparatus that substantially obviates one or more problems due to limitations and disadvantages of the prior art.

The present disclosure is to provide a display apparatus capable of improving the quality of the image realized on the outer surface of the device substrate which supports the driving circuit and the light-emitting device of each pixel area.

Also, the present disclosure is to provide a display apparatus capable of increasing the effective emission region of each pixel area which emits light toward the device substrate.

Additional advantages and features of the disclosure will be set forth in part in the description which follows and in part will become apparent to those having ordinary skill in the art upon examination of the following or may be learned from practice of the disclosure. The features and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display apparatus comprising a device substrate. A first main-emission region and a first sub-emission region are defined in a first pixel area of the device substrate. A driving circuit and a light-emitting device are disposed on the device substrate. The driving circuit is spaced away from the first main-emission region. The driving circuit includes a storage capacitor overlapping with the first sub-emission region. The light-emitting device includes a region overlapping with the first main-emission region, and a region overlapping with the storage capacitor of the driving circuit. The storage capacitor has a stacked structure of capacitor electrodes. Each of the capacitor electrodes is composed of a metal oxide.

The first sub-emission region may have a size smaller than the first main-emission region.

The storage capacitor may have a stacked structure of a first capacitor electrode and a second capacitor electrode. The second capacitor electrode may include a material different from the first capacitor electrode.

The first capacitor electrode may be a transparent electrode including one of ITO and IZO.

A bank insulating layer may be disposed on the device substrate. The bank insulating layer may define the first main-emission region and the first sub-emission region. The bank insulating layer may define a second main-emission region and a second sub-emission region in a second pixel area displaying a color different from the first pixel area. The second main-emission region of the second pixel area may have a size different from the first main-emission region of the first pixel area. The second sub-emission region of the second pixel area may have a size different from the first sub-emission region of the first pixel area.

The driving circuit may include a thin film transistor disposed between the first main-emission region and the first sub-emission region.

In another aspect, the display apparatus includes a device substrate. A driving circuit is disposed on the device substrate. The driving circuit includes a storage capacitor and at least one thin film transistor. The driving circuit is electrically connected to a first emission electrode. The first emission electrode includes a first electrode region disposed outside the driving circuit, and a second electrode region overlapping with the storage capacitor. An edge of the first emission electrode is covered by a bank insulating layer. The bank insulating layer exposes the first electrode region and the second electrode region of the first emission electrode. A second emission electrode is disposed on the bank insulating layer. The second emission electrode includes a region overlapping with the first electrode region and a region overlapping with the second electrode region. A light-emitting layer is disposed between the first electrode region of the first emission electrode and the second emission electrode, and between the second electrode region of the first emission electrode and the second emission electrode. The storage capacitor has a stacked structure of a first capacitor electrode and a second capacitor electrode. The first emission electrode, the first capacitor electrode and the second capacitor electrode has a higher transmittance than the second emission electrode.

The light-emitting layer may extend on a region between the first electrode region and the second electrode region of the first emission electrode. The bank insulating layer between the first electrode region and the second electrode region may be disposed between the first emission electrode and the light-emitting layer.

A light-blocking pattern may be disposed between the device substrate and the thin film transistor. The light-blocking pattern may include a region overlapping with a gate electrode of the thin film transistor. A buffer insulating layer may be disposed between the light-blocking pattern and the thin film transistor. The buffer insulating layer may extend beyond the light-blocking pattern. The light-blocking pattern may have a stacked structure of a first blocking layer and a second blocking layer. The first blocking layer may be disposed between the device substrate and the second blocking layer. The first blocking layer may have a transmittance higher than the second blocking layer. The first capacitor electrode may include the same material as the first blocking layer.

The buffer insulating layer may extend between the first capacitor electrode and the second capacitor electrode.

A semiconductor pattern of the thin film transistor may have a transmittance higher than the second emission electrode. The second capacitor electrode may include the same material as the semiconductor pattern.

The semiconductor pattern may be an oxide semiconductor.

The storage capacitor may further include a third capacitor electrode between the second capacitor electrode and the first emission electrode. The third capacitor electrode may have a transmittance higher than the second emission electrode.

A gate insulating layer of the thin film transistor may extend between the second capacitor electrode and the third capacitor electrode.

The gate electrode of the thin film transistor may have a stacked structure of a first gate conductive layer and a second gate conductive layer. The first gate conductive layer may be disposed between the semiconductor pattern and the second gate conductive layer. The first gate conductive layer may have a transmittance higher than the second gate conductive layer. The third capacitor electrode may include the same material as the first gate conductive layer.

BRIEF DESCRIPTION OF THE DRAWINGS

The accompanying drawings, which are included to provide a further understanding of the disclosure and are incorporated in and constitute a part of this disclosure, illustrate aspect(s) of the disclosure and together with the description serve to explain the principle of the disclosure. In the drawings:

FIGS. 3A to 13A and 3B to 13B are views sequentially showing a method of forming the display apparatus according to the aspect of the present disclosure.

DETAILED DESCRIPTION

Figure 1:
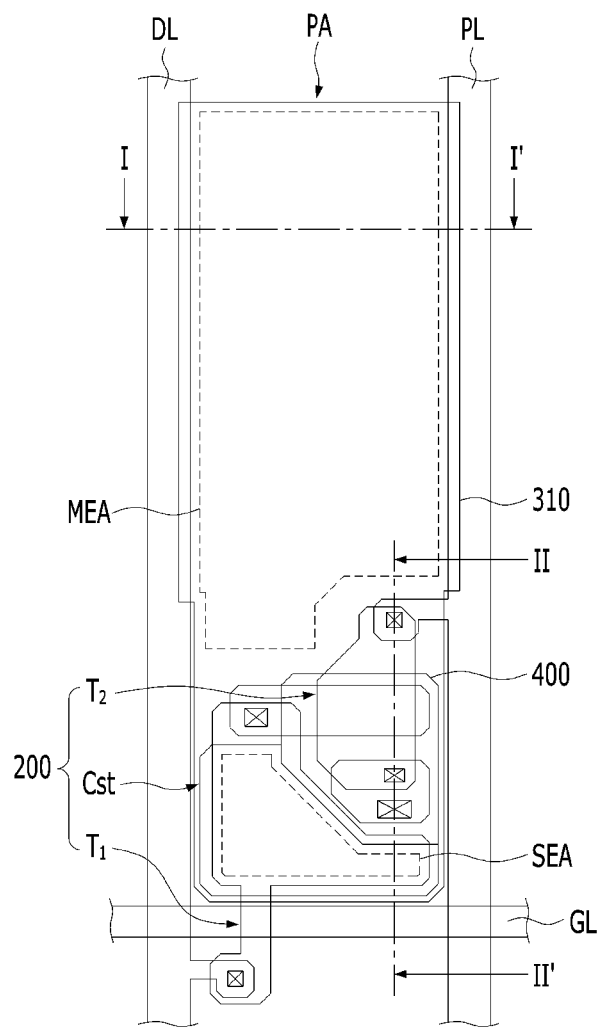
FIG. 1 is a view schematically showing a display apparatus according to an aspect of the present disclosure.

Hereinafter, details related to the above features, technical configurations, and operational effects of the aspects of the present disclosure will be clearly understood by the following detailed description with reference to the drawings, which illustrate some aspects of the present disclosure. Here, the aspects of the present disclosure are provided in order to allow the technical sprit of the present disclosure to be satisfactorily transferred to those skilled in the art, and thus the present disclosure may be embodied in other forms and is not limited to the aspects described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular aspects, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example aspects belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

(Aspects)

Figure 2A:
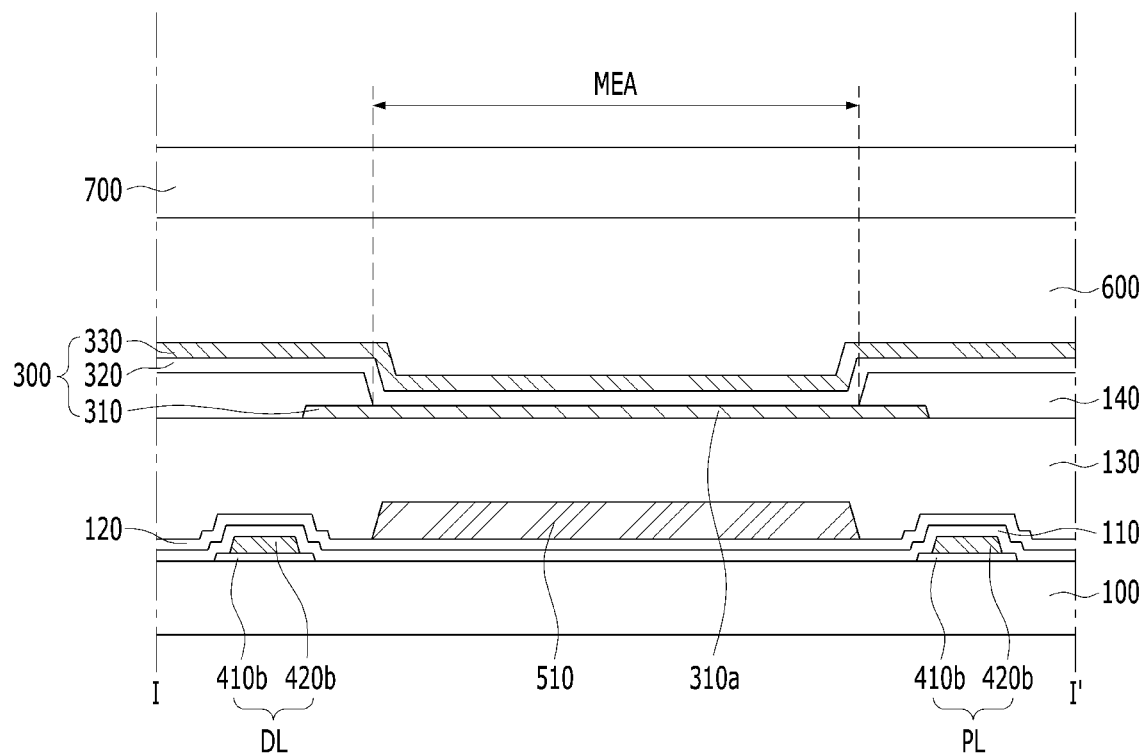
FIG. 2A is a view taken along I-I' of FIG. 1.
Figure 2B:
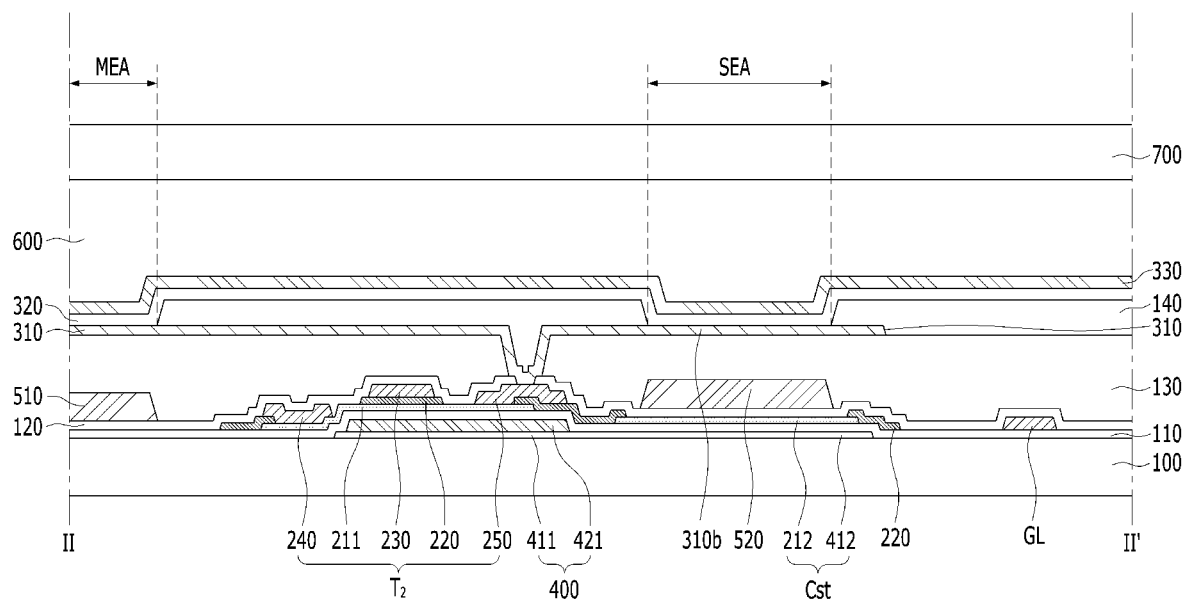
FIG. 2B is a view taken along II-IF of FIG. 1.

FIG. 1 is a view schematically showing a display apparatus according to an aspect of the present disclosure. FIG. 2A is a view taken along I-I' of FIG. 1. FIG. 2B is a view taken along II-IF of FIG. 1.

Referring to FIGS. 1, 2A and 2B, the display apparatus according to the aspect of the present disclosure may include a device substrate 100. The device substrate 100 may include an insulating material. The device substrate 100 may include a transparent material. For example, the device substrate 100 may include glass or plastic.

Signal lines GL, DL and PL may be disposed on the device substrate 100. Each of the signal lines GL, DL and PL may transmit a signal required for realizing image. For example, the signal lines GL, DL and PL may include a gate line GL applying a gate signal, a data line DL applying a data signal, and a power supply line PL supplying a power voltage.

The signal lines GL, DL and PL may define pixel areas PA. For example, the data line DL may intersect the gate line GL. The power supply line PL may extend parallel with the data line DL. For example, each of the pixel areas PA may be surrounded by the gate line GL, the data line DL and the power supply line PL.

A driving circuit 200 and a light-emitting device 300 may be disposed in each pixel area PA. For example, the device substrate 100 may support the driving circuit 200 and the light-emitting device 300 of each pixel area PA. The driving circuit 200 of each pixel area PA may be electrically connected to the signal lines GL, DL and PL. For example, the driving circuit 200 of each pixel area PA may generate a driving current corresponding to the data signal according to the gate signal. The driving circuit 200 of each pixel area PA may include at least one thin film transistor $T_1$ and $T_2$. For example, the thin film transistor $T_1$ and $T_2$ may include a semiconductor pattern 211, a gate insulating layer 220, a gate electrode 230, a source electrode 240 and a drain electrode 250.

The semiconductor pattern 211 may include a semiconductor material. The semiconductor pattern 211 may have a high transmittance. For example, the semiconductor pattern 211 may be an oxide semiconductor including a metal oxide, such as IGZO.

The semiconductor pattern 211 may include a source region, a drain region and a channel region. The channel region may be disposed between the source region and the drain region. The source region and the drain region may have a resistance lower than the channel region. For example, the source region and the drain region may include a conductorized region of the oxide semiconductor.

The gate insulating layer 220 may be disposed on the semiconductor pattern 211. For example, the semiconductor pattern 211 may be disposed between the device substrate 100 and the gate insulating layer 220. The gate insulating layer 220 may extend beyond the semiconductor pattern 211. For example, a side surface of the semiconductor pattern 211 may be covered by the gate insulating layer 220.

The gate insulating layer 220 may include an insulating material. For example, the gate insulating layer 220 may include silicon oxide (SiO) and/or silicon nitride (SiN). The gate insulating layer 220 may include a material having a high dielectric constant. For example, the gate insulating layer 220 may include a High-K material, such as hafnium oxide (HfO). The gate insulating layer 220 may have a multi-layer structure.

The gate electrode 230 may be disposed on the gate insulating layer 220. For example, the gate insulating layer 220 may be disposed between the semiconductor pattern 211 and the gate electrode 230. The gate electrode 230 may include a conductive material. For example, the gate electrode 230 may include a metal, such as aluminum (Al), chromium (Cr), molybdenum (Mo), copper (Cu), titanium (Ti) and tungsten (W). The gate electrode 230 may be insulated from the semiconductor pattern 211 by the gate insulating layer 220.

The gate electrode 230 may overlap the channel region of the semiconductor pattern 211. For example, the channel region of the semiconductor pattern 211 may have an electric conductivity corresponding to a voltage applied to the gate electrode 230. The source region and the drain region of the semiconductor pattern 211 may be disposed outside the gate electrode 230.

The source electrode 240 may include a conductive material. For example, the source electrode 240 may include a metal, such as aluminum (Al), chromium (Cr), molybdenum (Mo), copper (Cu), titanium (Ti) and tungsten (W). The source electrode 240 may include the same material as the gate electrode 230.

The source electrode 240 may be disposed on the same layer as the gate electrode 230. For example, the source electrode 240 may be disposed on the gate insulating layer 220. The source electrode 240 may be electrically connected to the source region of the semiconductor pattern 211. For example, the gate insulating layer 220 may partially expose the source region of the semiconductor pattern 211. The source electrode 240 may be in direct contact with a portion of the source region of the semiconductor pattern 211 exposed by the gate insulating layer 220.

The drain electrode 250 may include a conductive material. For example, the drain electrode 250 may include a metal, such as aluminum (Al), chromium (Cr), molybdenum (Mo), copper (Cu), titanium (Ti) and tungsten (W). The drain electrode 250 may include the same material as the source electrode 240.

The drain electrode 250 may be disposed on the same layer as the source electrode 240. For example, the drain electrode 250 may be disposed on the gate insulating layer 220. The gate electrode 230, the source electrode 240 and the drain electrode 250 may be formed simultaneously. The drain electrode 250 may be electrically connected to the drain region of the semiconductor pattern 211. For example, the gate insulating layer 220 may partially expose the drain region of the semiconductor pattern 211. The drain electrode 250 may be in direct contact with a portion of the drain region of the semiconductor pattern 211 exposed by the gate insulating layer 220.

A buffer insulating layer 110 may be disposed between the device substrate 100 and the thin film transistor $T_1$ and $T_2$ of each pixel area PA. The buffer insulating layer 110 may prevent pollution due to the device substrate 100 in a process of forming the thin film transistor $T_1$ and $T_2$ of each pixel area PA. For example, the buffer insulating layer 110 may completely cover an inside surface of the device substrate 100 toward the thin film transistor $T_1$ and $T_2$ of each pixel area PA.

The buffer insulating layer 110 may include an insulating material. For example, the buffer insulating layer 110 may include silicon oxide (SiO) and/or silicon nitride (SiN). The buffer insulating layer 110 may have a multi-layer structure.

A light-blocking pattern 400 may be disposed between the device substrate 100 and the buffer insulating layer 110. The light-blocking pattern 400 may prevent a change in characteristics of the thin film transistor $T_1$ and $T_2$ due to external light. For example, the light-blocking pattern 400 may include a region overlapping with the gate electrode 230 of the thin film transistor $T_1$ and $T_2$ in each pixel area PA. Thus, in the display apparatus according to the aspect of the present disclosure, the external light travelling toward the channel region of the semiconductor pattern 211 in each pixel area PA may be blocked by the light-blocking pattern 400.

The light-blocking pattern 400 may have a multi-layer structure. For example, the light-blocking pattern 400 may have a stacked structure of a first blocking layer 411 and a second blocking layer 421. The first blocking layer 411 may be disposed between the device substrate 100 and the second blocking layer 421. For example, the first blocking layer 411 may be in direct contact with the inside surface of the device substrate 100. The second blocking layer 421 may be disposed between the first blocking layer 411 and the buffer insulating layer 110.

The first blocking layer 411 and the second blocking layer 421 may include a conductive material. Some of the signal lines GL, DL and PL may be formed simultaneously with the light-blocking pattern 400. For example, the data line DL and the power supply line PL may have the stacked structure same as the light-blocking pattern 400. For example, the data line DL may have a stacked structure of a first data conductive layer 413 and a second data conductive layer 423, and the power supply line PL may have a stacked structure of a first power conductive layer 414 and a second power conductive layer 424. The first data conductive layer 413 and the first power conductive layer 414 may have the same thickness as the first blocking layer 411. The second data conductive layer 423 and the second power conductive layer 424 may have the same thickness as the second blocking layer 421.

The first blocking layer 411 may include a material having high adhesion to the device substrate 100. The first blocking layer 411 may include a material having high transmittance. For example, the first blocking layer 411 may be a transparent electrode composed of a metal oxide, such as ITO and IZO. The first data conductive layer 413 and the first power conductive layer 414 may include the same material as the first blocking layer 411. For example, the first data conductive layer 413 and the first power conductive layer 414 may be a transparent electrode composed of a metal oxide, such as ITO and IZO. Thus, in the display apparatus according to the aspect of the present disclosure, the separation of the data line DL, the power supply line PL and the light-blocking pattern 400 may be prevented.

The second blocking layer 421 may include a material capable of blocking light. The second blocking layer 421 may have a resistance lower than the first blocking layer 411. For example, the second blocking layer 421 may include a metal, such as aluminum (Al), copper (Cu), titanium (Ti) and silver (Ag). The second data conductive layer 423 and the second power conductive layer 424 may include the same material as the second blocking layer 421. A thickness of the second blocking layer 421 may be larger than a thickness of the first blocking layer 411. For example, the second data conductive layer 423 and the second power conductive layer 424 may be thicker than the first data conductive layer 413 and the first power conductive layer 414, respectively. Thus, in the display apparatus according to the aspect of the present disclosure, the resistance of the data line DL and the power supply line PL may be sufficiently lowered.

The light-emitting device 300 of each pixel area PA may be electrically connected to the driving circuit 200 of the corresponding pixel area PA. For example, the driving current generated from the driving circuit 200 of each pixel area PA may be supplied to the light-emitting device 300 of the corresponding pixel area PA. The operation of the light-emitting device 300 in each pixel area PA may be maintained by the driving circuit of the corresponding pixel area PA during one frame. For example, the driving circuit 200 of each pixel area PA may include a first thin film transistor $T_1$, a second thin film transistor $T_2$ and a storage capacitor Cst.

The first thin film transistor $T_1$ may transmit the data signal to the second thin film transistor $T_2$ according to the gate signal. For example, the gate electrode 230 of the first thin film transistor $T_1$ may be electrically connected to the gate line GL, and the source electrode 240 of the first thin film transistor $T_1$ may be electrically connected to the data line DL. The second thin film transistor $T_2$ may generate the driving current corresponding to the data signal. For example, the gate electrode 230 of the second thin film transistor $T_2$ may be electrically connected to the drain electrode 250 of the first thin film transistor $T_1$, and the source electrode 240 of the second thin film transistor $T_2$ may be electrically connected to the power supply line PL. The light-emitting device 300 of each pixel area PA may be electrically connected to the drain electrode 250 of the second thin film transistor $T_2$ in the corresponding pixel area PA.

The second thin film transistor $T_2$ may have the stacked structure same as the first thin film transistor $T_1$. For example, the semiconductor pattern 211 of the second thin film transistor $T_2$ may be disposed on the same layer as the semiconductor pattern 211 of the first thin film transistor $T_1$. The semiconductor pattern 211 of the second thin film transistor $T_2$ may include the same material as the semiconductor pattern 211 of the first thin film transistor $T_1$. For example, the semiconductor pattern 211 of the second thin film transistor $T_2$ may be formed simultaneously with the semiconductor pattern 211 of the first thin film transistor $T_1$. Thus, in the display apparatus according to the aspect of the present disclosure, a process of forming the first thin film transistor $T_1$ and the second thin film transistor $T_2$ may be simplified.

Some of the signal lines GL, DL and PL may be formed simultaneously with the first thin film transistor $T_1$ and/or the second thin film transistor $T_2$. For example, the gate line GL may include the same material as the gate electrode 230 of the second thin film transistor $T_2$. The gate line GL may be disposed on the buffer insulating layer 110. Thus, in the display apparatus according to the aspect of the present disclosure, a process of forming the signal lines GL, DL and PL may be simplified.

The storage capacitor Cst may maintain the operation of the second thin film transistor $T_2$ during one frame. For example, the storage capacitor Cst may be electrically connected to the gate electrode 230 of the second thin film transistor $T_2$. The storage capacitor Cst may have a stacked structure of capacitor electrodes 412 and 212. For example, the storage capacitor Cst may have a stacked structure of a first capacitor electrode 412 and a second capacitor electrode 212. The gate electrode 230 of the second thin film transistor $T_2$ may be electrically connected to the first capacitor electrode 412 or the second capacitor electrode 212.

The first capacitor electrode 412 may be disposed close to the device substrate 100. For example, the first capacitor electrode 412 may be disposed between the device substrate 100 and the second capacitor electrode 212. The first capacitor electrode 412 may be in direct contact with the inside surface of the device substrate 100.

The first capacitor electrode 412 may include a conductive material. The first capacitor electrode 412 may include a material having high transmittance. For example, the first capacitor electrode 412 may be a transparent electrode composed of a metal oxide, such as ITO and IZO. The first capacitor electrode 412 may include the same material as the first blocking layer 411. The first capacitor electrode 412 may be disposed on the same layer as the first blocking layer 411. For example, the first capacitor electrode 412 may be formed simultaneously with the first blocking layer 411. The first capacitor electrode 412 may have the same thickness as the first blocking layer 411. For example, the first capacitor electrode 412 may be connected to the first blocking layer 411.

The second capacitor electrode 212 may be spaced away from the first capacitor electrode 412. For example, the buffer insulating layer 110 may extend between the first capacitor electrode 412 and the second capacitor electrode 212. The second capacitor electrode 212 may be insulated from the first capacitor electrode 412 by the buffer insulating layer 110.

The second capacitor electrode 212 may include a conductive material. The second capacitor electrode 212 may include a material having high transmittance. For example, the second capacitor electrode 212 may include a metal oxide. The second capacitor electrode 212 may include a material different from the first capacitor electrode 412. For example, the second capacitor electrode 212 may include the same material as the semiconductor pattern 211 of the second thin film transistor $T_2$. The second capacitor electrode 212 may have a resistance lower than the channel region of the semiconductor pattern 211. For example, the second capacitor electrode 212 may be a transparent electrode composed of a conductorized region of the oxide semiconductor. That is, in the display apparatus according to the aspect of the present disclosure, the driving circuit 200 of each pixel area PA may include a transparent storage capacitor Cst.

The second capacitor electrode 212 may be disposed on the same layer as the semiconductor pattern 211 of the second thin film transistor $T_2$. For example, the second capacitor electrode 212 may be formed simultaneously with the semiconductor pattern 211 of the second thin film transistor $T_2$. The second capacitor electrode 212 may have the same thickness as the semiconductor pattern 211 of the second thin film transistor $T_2$. The second capacitor electrode 212 may be insulated from the second semiconductor pattern 211 of the second thin film transistor $T_2$. For example, the second capacitor electrode 212 may be spaced away from the semiconductor pattern 211 of the second thin film transistor $T_2$. The second capacitor electrode 212 may overlap a portion of the first capacitor electrode 412.

A lower passivation layer 120 may be disposed between the driving circuit 200 and the light-emitting device 300 of each pixel area PA. The lower passivation layer 120 may prevent the damage of the driving circuit 200 in each pixel area PA due to the external moisture and impact. For example, the first thin film transistor $T_1$, the second thin film transistor $T_2$ and the storage capacitor Cst of each pixel area PA may be completely covered by the lower passivation layer 120. The lower passivation layer 120 may extend beyond the driving circuit 200 of each pixel area PA. For example, the lower passivation layer 120 on each pixel area PA may be connected to the lower passivation layer 120 on adjacent pixel area PA.

The lower passivation layer 120 may include an insulating material. For example, the lower passivation layer 120 may include silicon nitride (SiN).

An over-coat layer 130 may be disposed between the lower passivation layer 120 and the light-emitting device 300 of each pixel area PA. The over-coat layer 130 may remove a thickness difference due to the driving circuit 200 of each pixel area PA. For example, a surface of the over-coat layer 130 toward the light-emitting device 300 of each pixel area PA may be a flat surface. The over-coat layer 130 may extend along the lower passivation layer 120. For example, the over-coat layer 130 on each pixel area PA may be connected to the over-coat layer 130 on adjacent pixel area PA.

The over-coat layer 130 may include an insulating material. The over-coat layer 130 may include a material different from the lower passivation layer 120. For example, the over-coat layer 130 may include an organic insulating material.

The light-emitting device 300 of each pixel area PA may be disposed on the over-coat layer 130. The light-emitting device 300 of each pixel area PA may emit light displaying a specific color. For example, the light-emitting device 300 of each pixel area PA may include a first emission electrode 310, a light-emitting layer 320 and a second emission electrode 330, which are sequentially stacked on the over-coat layer 130.

The first emission electrode 310 may include a conductive material. The first emission electrode 310 may include a material having high transmittance. For example, the first emission electrode 310 may be a transparent electrode composed of a metal oxide, such as ITO.

The light-emitting layer 320 may generate light having luminance corresponding to a voltage difference between the first emission electrode 310 and the second emission electrode 330. For example, the light-emitting layer 320 may include an emission material layer (EML) having an emission material. The emission material may include an organic material, an inorganic material or a hybrid material. For example, the display apparatus according to the aspect of the present disclosure may be an organic light-emitting display apparatus including an organic emission material.

The light-emitting layer 320 may have a multi-layer structure. For example, the light-emitting layer 320 may further include at least one of a hole injection layer (HIL), a hole transmitting layer (HTL), an electron transmitting layer (ETL) and an electron injection layer (EIL). Thus, in the display apparatus according to the aspect of the present disclosure, emission efficiency of the light-emitting device 300 in each pixel area PA may be improved.

The second emission electrode 330 may include a conductive material. The second emission electrode 330 may include a material different from the first emission electrode 310. The second emission electrode 330 may include a material having high reflectance. For example, the second emission electrode 330 may include a metal, such as aluminum (Al) and silver (Ag). The first emission electrode 310 may have a transmittance higher than the second emission electrode 330. Thus, in the display apparatus according to the aspect of the present disclosure, the light generated from the light-emitting layer 320 of each pixel area PA may be emitted through the first emission electrode 310 of the corresponding pixel area PA.

The first emission electrode 310 of each pixel area PA may be electrically connected to the driving circuit 200 of the corresponding pixel area PA. For example, the lower passivation layer 120 and the over-coat layer 130 may include electrode contact holes partially exposing the drain electrode 250 of the second thin film transistor $T_2$ in each pixel area PA. The first emission electrode 310 of each pixel area PA may be connected to the drain electrode 250 of the second thin film transistor $T_2$ in the corresponding pixel area PA through one of the electrode contact holes. For example, the first emission electrode 310 of each pixel area PA may be in direct contact with the drain electrode 250 of the second thin film transistor $T_2$ exposed by the corresponding electrode contact hole.

The first emission electrode 310 of each pixel area PA may extend beyond the second thin film transistor $T_2$ of the corresponding pixel area PA. For example, the first emission electrode 310 of each pixel area PA may include a first electrode region 310a disposed outside the driving circuit 200 of the corresponding pixel area PA, and a second electrode region 310b overlapping with the storage capacitor Cst of the corresponding driving circuit 200.

The first emission electrode 310 of each pixel area PA may be insulated from the first emission electrode 310 of adjacent pixel area PA. For example, the first emission electrode 310 of each pixel area PA may be spaced away from the first emission electrode 310 of adjacent pixel area PA. A bank insulating layer 140 may be disposed on the over-coat layer 130. The bank insulating layer 140 may include an insulating material. For example, the bank insulating layer 140 may include an organic insulating material. The bank insulating layer 140 may include a material different from the over-coat layer 130. An edge of the first emission electrode 310 in each pixel area PA may be covered by the bank insulating layer 140. Thus, in the display apparatus according to the aspect of the present disclosure, the light-emitting device 300 of each pixel area PA may be controlled, independently.

The bank insulating layer 140 may define a main-emission region MEA and a sub-emission region SEA in each pixel area PA. The sub-emission region SEA may have a size smaller than the main-emission region MEA. For example, the main-emission region MEA of each pixel area PA may be disposed outside the driving circuit 200 of the corresponding pixel area PA and the sub-emission region SEA of each pixel area PA may overlap the storage capacitor Cst of the corresponding pixel area PA. For example, the bank insulating layer 140 may expose the first electrode region 310*a* and the second electrode region 310*b* of the first emission electrode 310 in each pixel area PA. The light-emitting layer 320 and the second emission electrode 330 of each pixel area PA may be stacked on the first electrode region 310*a* and the second electrode region 310*b* of the corresponding first emission electrode 310 which are exposed by the bank insulating layer 140. That is, in the display apparatus according to the aspect of the present disclosure, the light-emitting device 300 of each pixel area PA may be disposed on the over-coat layer 130 of the main-emission region MEA and the sub-emission region SEA, which are defined in the corresponding pixel area PA by the bank insulating layer 140. The first capacitor electrode 412 and the second capacitor electrode 212 of the storage capacitor Cst may have a transmittance higher than the second emission electrode 330. Thus, in the display apparatus according to the aspect of the present disclosure, the light generated from the main-emission region MEA of each pixel area PA may emitted outside through the first electrode region 310*a* of the corresponding pixel area PA and the device substrate 100, and the light generated from the sub-emission regions SEA of each pixel area PA may be emitted outside through the second electrode region 310*b* of the corresponding pixel area PA, the storage capacitor Cst of the corresponding pixel area PA and the device substrate 100.

The light-emitting layer 320 and the second emission electrode 330 of each pixel area PA may extend on a region between the first electrode region 310*a* and the second electrode region 310*b* of the first emission electrode 310 in the corresponding pixel area PA. For example, the light-emitting layer 320 on the first electrode region 310*a* of each pixel area PA may include the same material as the light-emitting layer 320 on the second electrode region 310*b* of the corresponding pixel area PA. Thus, in the display apparatus according to the aspect of the present disclosure, the light emitted from the sub-emission region SEA of each pixel area PA may have the same wavelength and the same illuminance as the light emitted from the main-emission region MEA of the corresponding pixel area PA.

The bank insulating layer 140 between the first electrode region 310*a* and the second electrode region 310*b* of each pixel area PA may be disposed between the first emission electrode 310 and the light-emitting layer 320 of the corresponding pixel area PA. For example, the light-emitting layer 320 and the second emission electrode 330 of each pixel area PA may extend along a surface of the bank insulating layer 140 opposite to the device substrate 100. The light-emitting layer 320 and the second emission electrode 330 of each pixel area PA may be disposed on the bank insulating layer 140 at the outside of the first electrode region 310*a* and the second electrode region 310*b* of the corresponding pixel area PA. Thus, in the display apparatus according to the aspect of the present disclosure, the light may be generated only in the main-emission region MEA and the sub-emission region SEA of each pixel area PA. Therefore, in the display apparatus according to the aspect of the present disclosure, a driving voltage of each pixel area PA may be reduced.

A color filter 510 and 520 may be disposed between the device substrate 100 and the first emission electrode 310 of each pixel area PA. The color filter 510 and 520 of each pixel area PA may realize a specific color using the light emitted from the light-emitting device 300 of the corresponding pixel area PA. For example, the color filter 510 and 520 of each pixel area PA may include a first color filter 510 overlapping with the main-emission region MEA of the corresponding pixel area PA, and a second color filter 520 overlapping with the sub-emission region SEA of the corresponding pixel area PA. The first color filter 510 of each pixel area PA may overlap the first electrode region 310*a* of the corresponding pixel area PA. The second color filter 520 of each pixel area PA may overlap the second electrode region 310*b* of the corresponding pixel area PA.

The second color filter 520 of each pixel area PA may include the same material as the first color filter 510 of the corresponding pixel area PA. That is, in the display apparatus according to the aspect of the present disclosure, the sub-emission region SEA of each pixel area PA may realize the same color as the main-emission region MEA of the corresponding pixel area PA. Thus, in the display apparatus according to the aspect of the present disclosure, color change due to the deterioration difference between the main-emission region MEA and the sub-emission region SEA of each pixel area PA may be prevented.

The second color filter 520 of each pixel area PA may be disposed on the same layer as the first color filter 510 of the corresponding pixel area PA. For example, the first color filter 510 and the second color filter 520 of each pixel area PA may be disposed between the lower passivation layer 120 and the over-coat layer 130. A thickness difference due to the first color filter 510 and the second color filter 520 of each pixel area PA may be removed by the over-coat layer 130. The second color filter 520 of each pixel area PA may be formed simultaneously with the first color filter 510 of the corresponding pixel area PA. For example, the second color filter 520 of each pixel area PA may have the same thickness as the first color filter 510 of the corresponding pixel area PA. Thus, in the display apparatus according to the aspect of the present disclosure, a process of forming the first color filter 510 and the second color filter 520 in each pixel area PA may be simplified.

An encapsulating layer 600 and an encapsulation substrate 700 may be stacked on the second electrode 330 of each pixel area PA. The encapsulating layer 600 and the encapsulation substrate 700 may prevent the damage of the light-emitting device 300 in each pixel area PA due to the external moisture and impact. The encapsulating layer 600 may include a material having adhesion. For example, the encapsulation substrate 700 may be attached to the device substrate 100 in which the light-emitting device 300 of each pixel area PA is formed, by the encapsulating layer 600. The encapsulation substrate 700 may include a material harder than the encapsulating layer 600. The encapsulation substrate 700 may include a material having high thermal conductivity. For example, the encapsulation substrate 700 may include a metal, such as aluminum (Al), nickel (Ni) and iron (Fe). Thus, in the display apparatus according to the aspect of the present disclosure, the external moisture and impact may be blocked by the encapsulating layer 600 and the encapsulation substrate 700, and heat generated from the driving circuit 200 and the light-emitting device 300 of each pixel area PA may be rapidly radiated to the outside through the encapsulation substrate 700.

Accordingly, the display apparatus according to the aspect of the present disclosure may include the driving circuit 200 and the light-emitting device 300 in each pixel area PA, wherein the driving circuit 200 of each pixel area PA includes a transparent storage capacitor Cst, and wherein the light-emitting device 300 of each pixel area PA may include a region disposed outside the driving circuit 200 of the corresponding pixel area PA and a region overlapping with the storage capacitor Cst of the corresponding pixel area PA. That is, in the display apparatus according to the aspect of the present disclosure, a portion of a region in which the driving circuit 200 of each pixel area PA is disposed may emit the light for realizing the image on an outer surface of the device substrate 100. Thus, in the display apparatus according to the aspect of the present disclosure, an effective emission region of each pixel area PA to realize the image on the outer surface of the device substrate 100 may be increased. Therefore, in the display apparatus according to the aspect of the present disclosure, the amount of the light emitted to the outside through the device substrate 100 may be increased, and the quality of the image realized on the outer surface of the device substrate 100 may be improved.

FIGS. 3A to 13A and 3B to 13B are views sequentially showing a method of forming the display apparatus according to the aspect of the present disclosure.

Figure 3A:
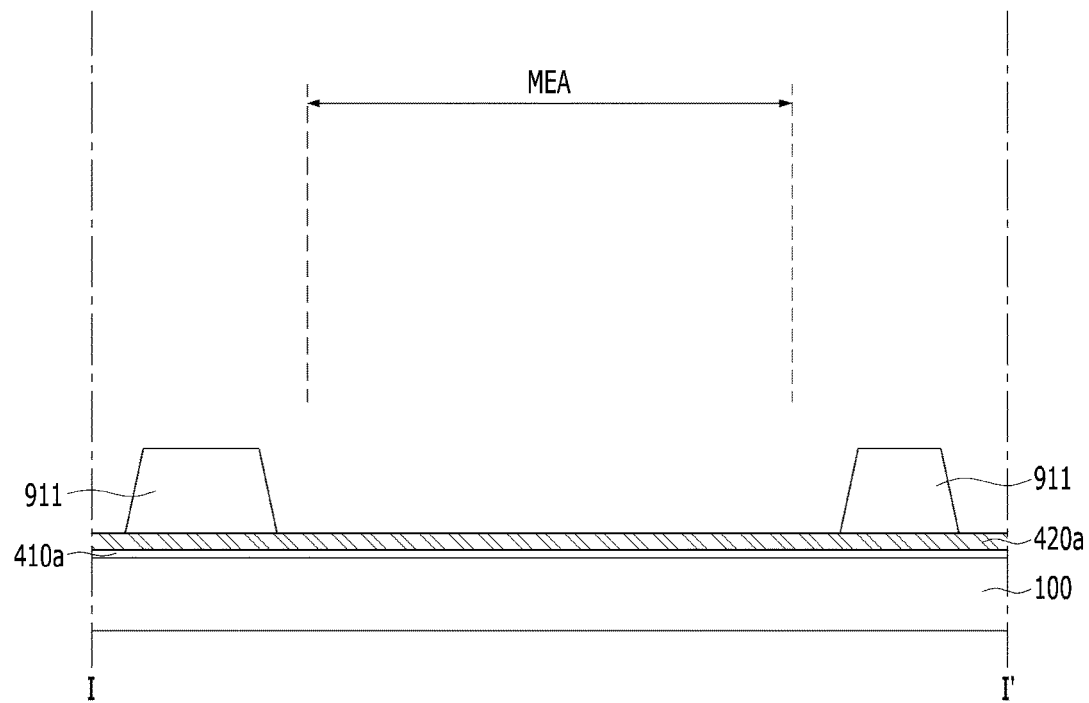
Figure 3B:
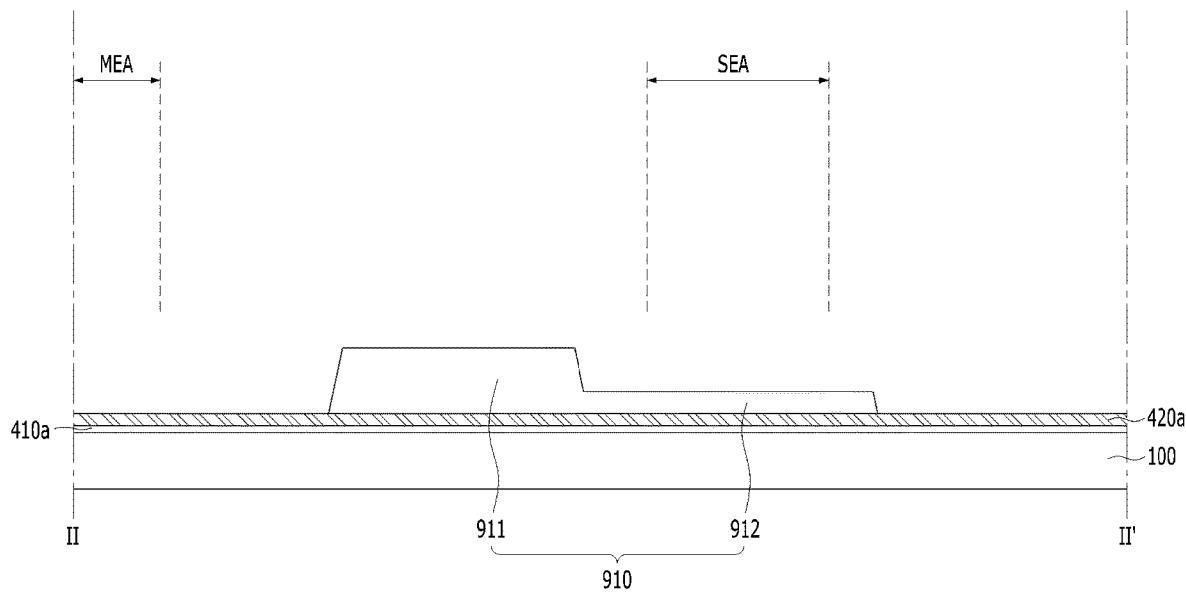

A method of forming the display apparatus according to the aspect of the present disclosure will be described with reference to FIGS. 1, 2A to 13A and 2B to 13B. First, as shown in FIGS. 1, 3A and 3B, the method of forming the display apparatus according to the aspect of the present disclosure may include a step of preparing a device substrate 100 in which a main-emission region MEA and a sub-emission region SEA are defined in each pixel area PA, a step of forming a first blocking material layer 410a on the device substrate 100, a step of forming a second blocking material layer 420a on the first blocking material layer 410a, and a step of forming a first mask pattern 910 on the second blocking material layer 420a.

The first blocking material layer 410a may be formed of a conductive material. The first blocking material layer 410a may be formed of a material having high adhesion to the device substrate 100. The first blocking material layer 410a may be formed of a material having high transmittance. For example, the first blocking layer 410a may be a transparent electrode layer composed of a metal oxide, such as ITO.

The second blocking material layer 420a may be formed of a conductive material. The second blocking material layer 420a may be formed of a material capable of blocking light. The second blocking material layer 420a may be formed of a material having resistance lower than the first blocking material layer 410a. For example, the second blocking material layer 420a may be formed of a metal, such as aluminum (Al), copper (Cu), titanium (Ti) and silver (Ag). The second blocking material layer 420a may be formed thicker than the first blocking material layer 410a.

The first mask pattern 910 may be formed on a region in which a data line DL, a power supply line PL, a light-blocking pattern 400 and a storage capacitor Cst are to be formed by a subsequent process. For example, a portion of the second blocking material layer 420a overlapping with the main-emission region MEA which is to be defined by a subsequent process may be disposed outside the first mask pattern 910.

The first mask pattern 910 may include a first pattern region 911 and a second pattern region 912. The first pattern region 911 may overlap a region in which the data line DL, the power supply line PL and the light-blocking pattern 400 are to be formed by a subsequent process. The second pattern region 912 may overlap a region in which the storage capacitor Cst is to be formed by a subsequent process. For example, the second pattern region 912 may overlap a region in which the sub-emission region SEA is to be defined by a subsequent process. The second pattern region 912 may be in direct contact with a portion of the first pattern region 911 overlapping with a region in which the light-blocking pattern 400 is to be formed by a subsequent process.

The second pattern region 912 may have a thickness thinner than the first pattern region 911. For example, the step of forming the first mask pattern 910 may include a step of forming mask material layer on the second blocking material layer 420a, and a step of exposing the mask material layer using a halftone mask.

Figure 4A:
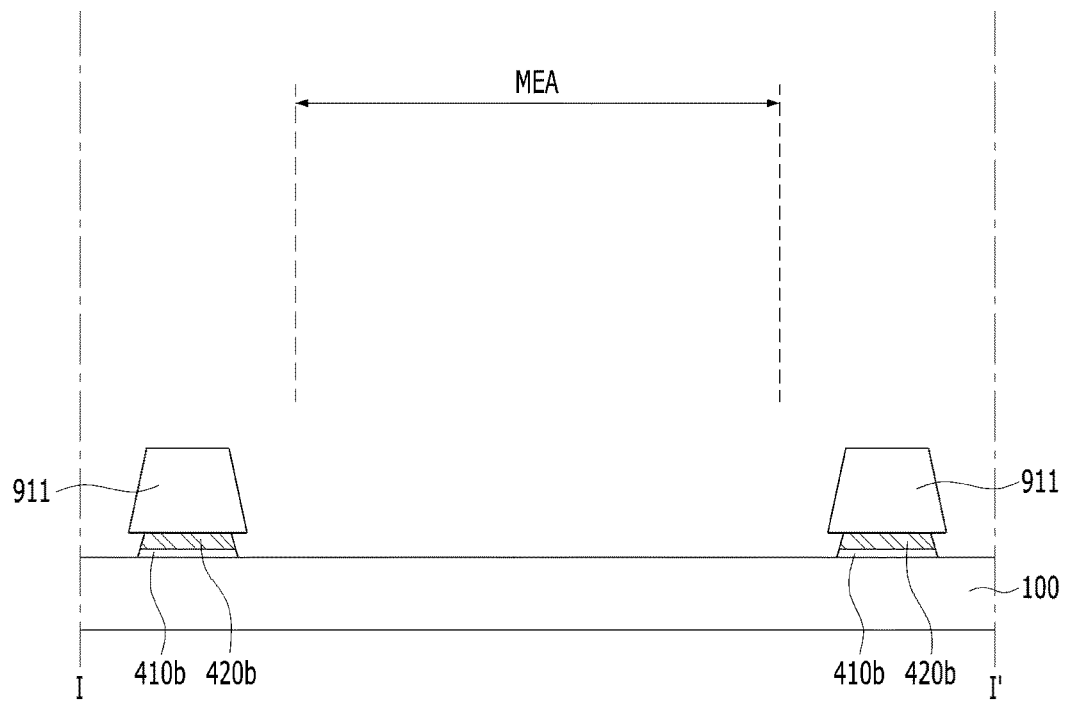
Figure 4B:
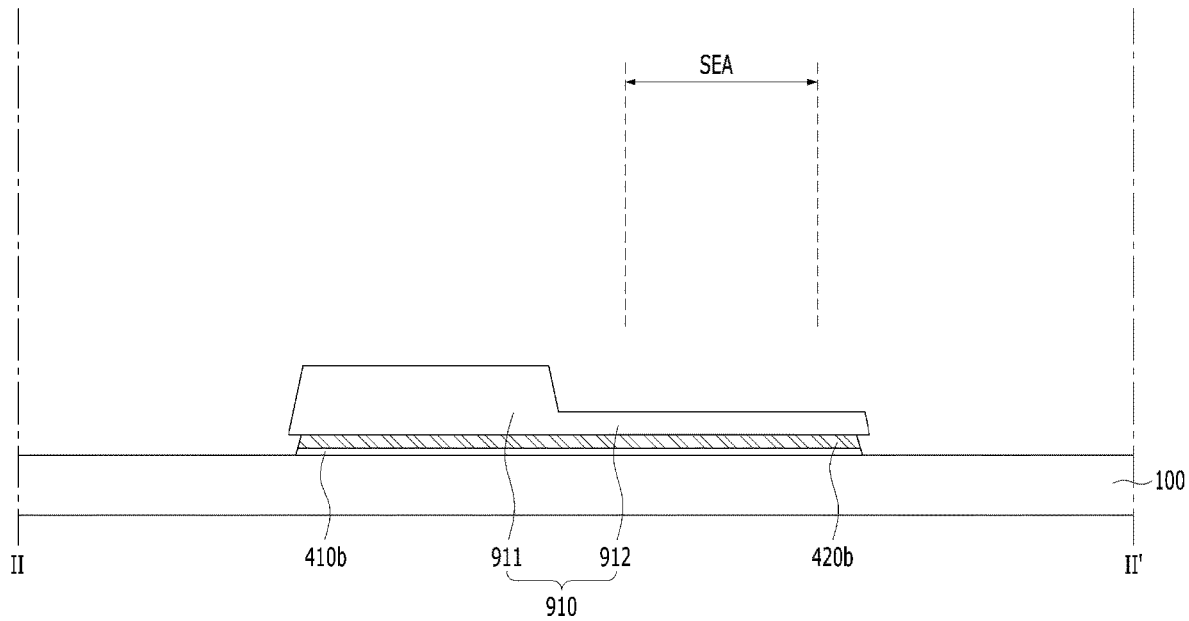

As shown in FIGS. 4A and 4B, the method of forming the display apparatus according to the aspect of the present disclosure may include a step of forming a first blocking material pattern 410b and a second blocking material pattern 420b using the first mask pattern 910.

The step of forming the first blocking material pattern 410b and the second blocking material pattern 420b may include a step of etching by using the first mask pattern 910. For example, the step of forming the first blocking material pattern 410b and the second blocking material pattern 420b may include a step of etching a portion of the second blocking material layer 420a exposed by the first mask pattern 910, and a step of etching a portion of the first blocking material layer 410a exposed by etching the portion of the second blocking material layer 420a. The step of etching the portion of the first blocking material layer 410a may be successively performed with the step of etching the portion of the second blocking layer 420a. For example, a side surface of the first blocking material pattern 410b may be continuous with a side surface of the second blocking material pattern 420b.

Figure 5A:
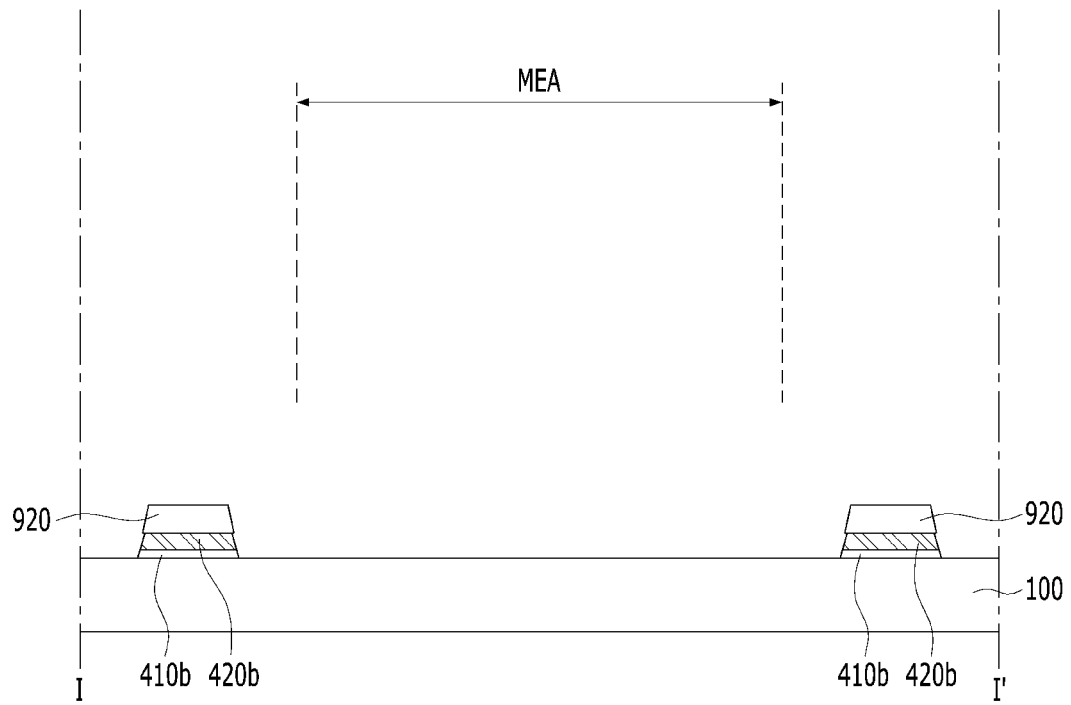
Figure 5B:
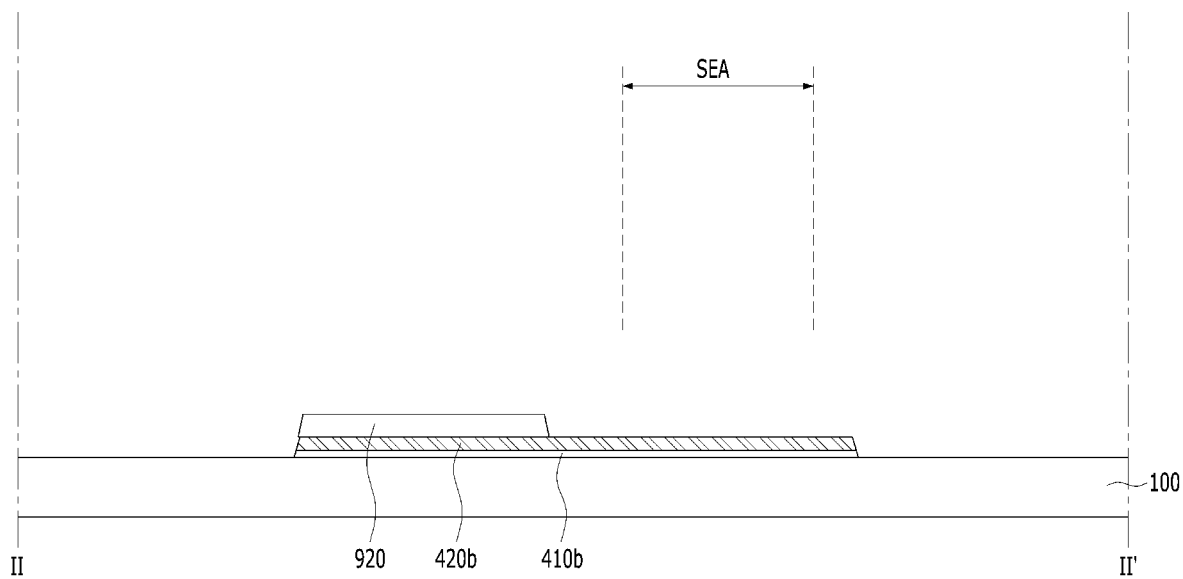

As shown FIGS. 5A and 5B, the method of forming the display apparatus according to the aspect of the present disclosure may include a step of forming a second mask pattern 920 on the second blocking material pattern 420b.

The second mask pattern 920 may overlap a region in which the data line DL, the power supply line PL and the light-blocking pattern 400 are to be formed by a subsequent process. The second mask pattern 920 may expose a portion of the second blocking material pattern 420b on a region in which the storage capacitor Cst is to be formed by a subsequent process. The second mask pattern 920 may be formed by using the first mask pattern 910. For example, the step of forming the second mask pattern 920 may include a step of reducing the overall thickness of the first mask pattern 910. The step of reducing the overall thickness of the first mask pattern 910 may include a process of cleaning the first mask pattern 910.

Figure 6A:
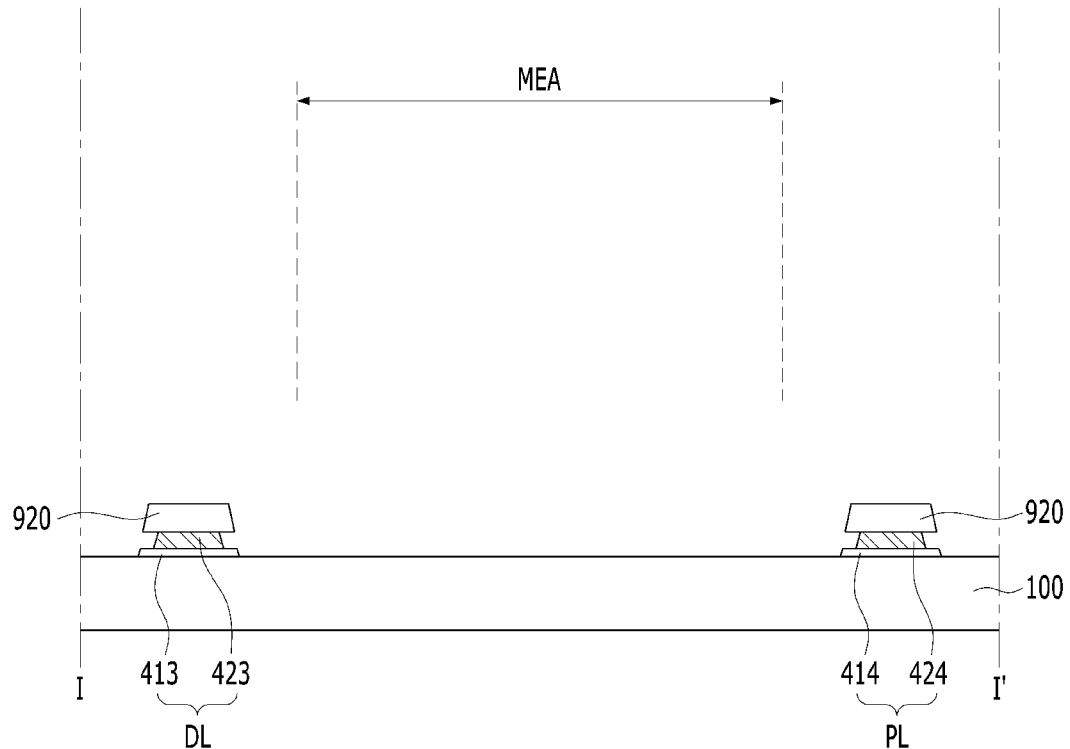
Figure 6B:
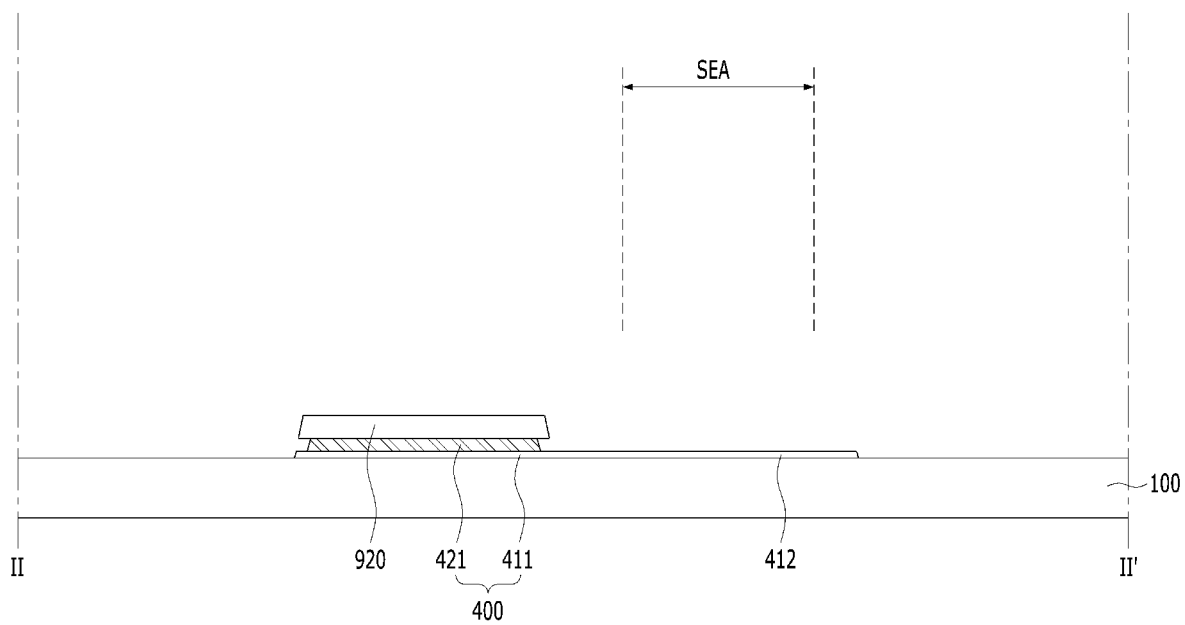

As shown in FIGS. 6A and 6B, the method of forming the display apparatus according to the aspect of the present disclosure may include a step of forming the data line DL, the power supply line PL, the light-blocking pattern 400 and the first capacitor electrode 412 on the device substrate 100.

The step of forming the data line DL, the power supply line PL, the light-blocking pattern 400 and the first capacitor electrode 412 may include a step of etching a portion of the second blocking material pattern 420b exposed by the second mask pattern 920. For example, the light-blocking pattern 400, the data line DL and the power supply line PL may have a double layer structure, respectively. The light-blocking pattern 400 may have a stacked structure of a first blocking layer 411 and a second blocking layer 421. The data line DL may have a stacked structure of a first data conductive layer 413 and a second data conductive layer 423. The power supply line PL may have a stacked structure of a first power conductive layer 414 and a second power conductive layer 424.

The first capacitor electrode 412 may be formed on a region in which a portion of the second blocking material pattern 420b is etched by an etching process using the second mask pattern 920. For example, the first capacitor electrode 412 may be formed on the sub-emission region SEA which is to be defined by a subsequent process. The first capacitor electrode 412 may be connected to the first blocking layer 411.

Figure 7A:
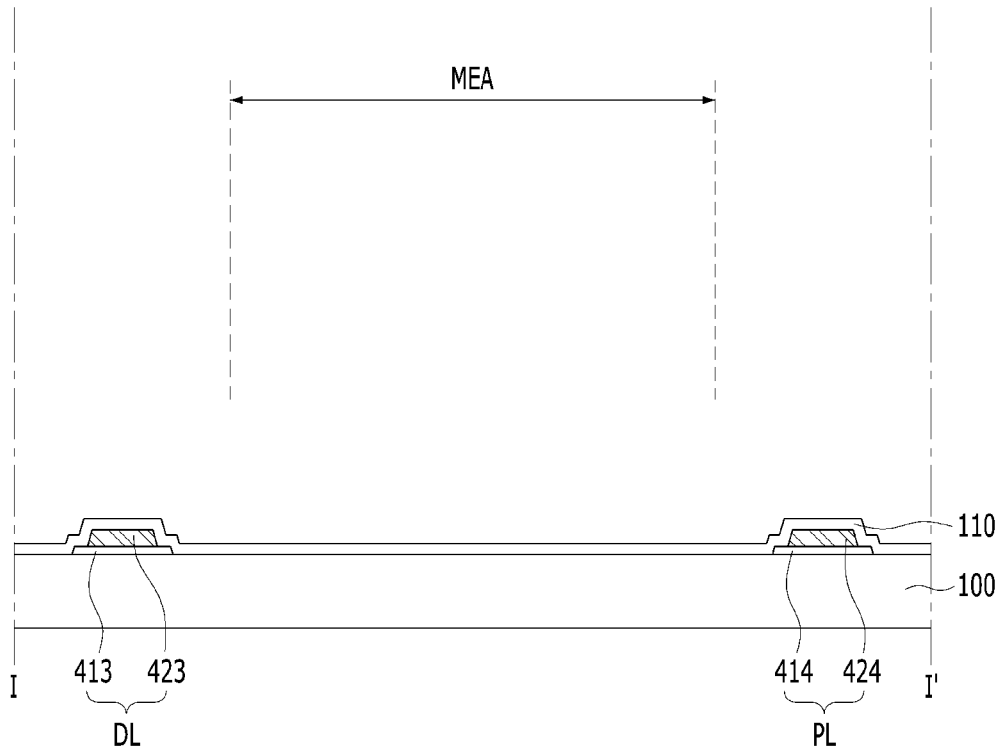
Figure 7B:
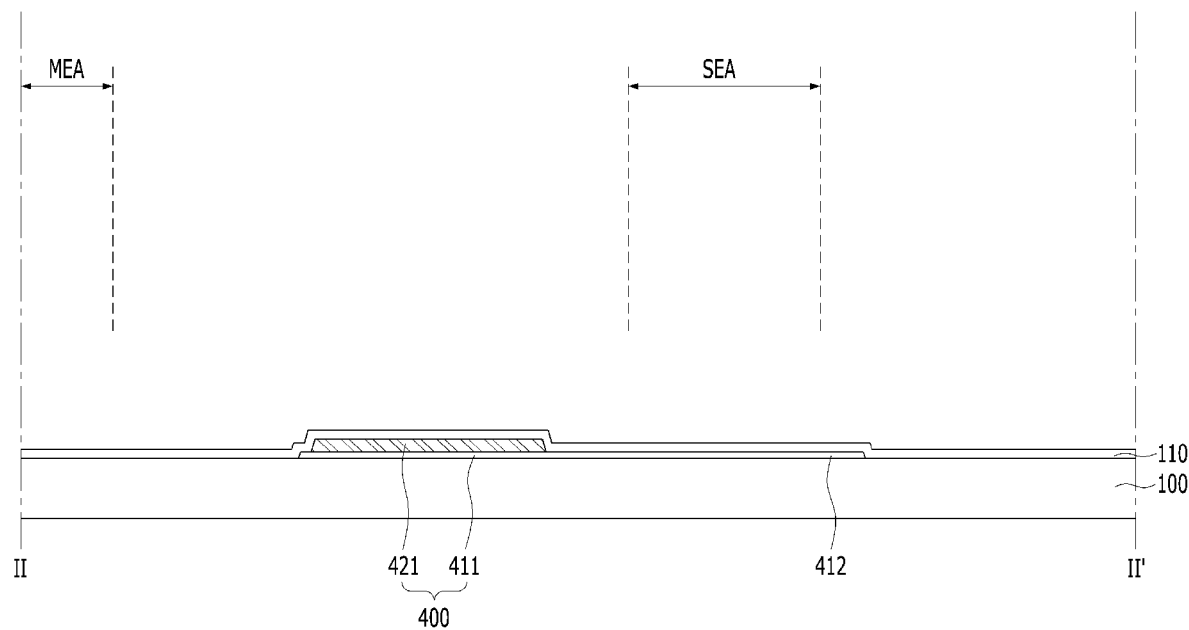

As shown in FIGS. 7A and 7B, the method of forming the display apparatus according to the aspect of the present disclosure may include a step of removing the second mask pattern 920 and a step of forming a buffer insulating layer 110 on the data line DL, the power supply line PL, the light-blocking pattern 400 and the first capacitor electrode 412.

The buffer insulating layer 110 may be formed of an insulating material. For example, the step of forming the buffer insulating layer 110 may include a step of depositing silicon oxide (SiO) and/or silicon nitride (SiN) on the device substrate 100 in which the data line DL, the power supply line PL, the light-blocking pattern 400 and the first capacitor electrode 412 are formed. The buffer insulating layer 110 may be formed in a multi-layer structure.

Figure 8A:
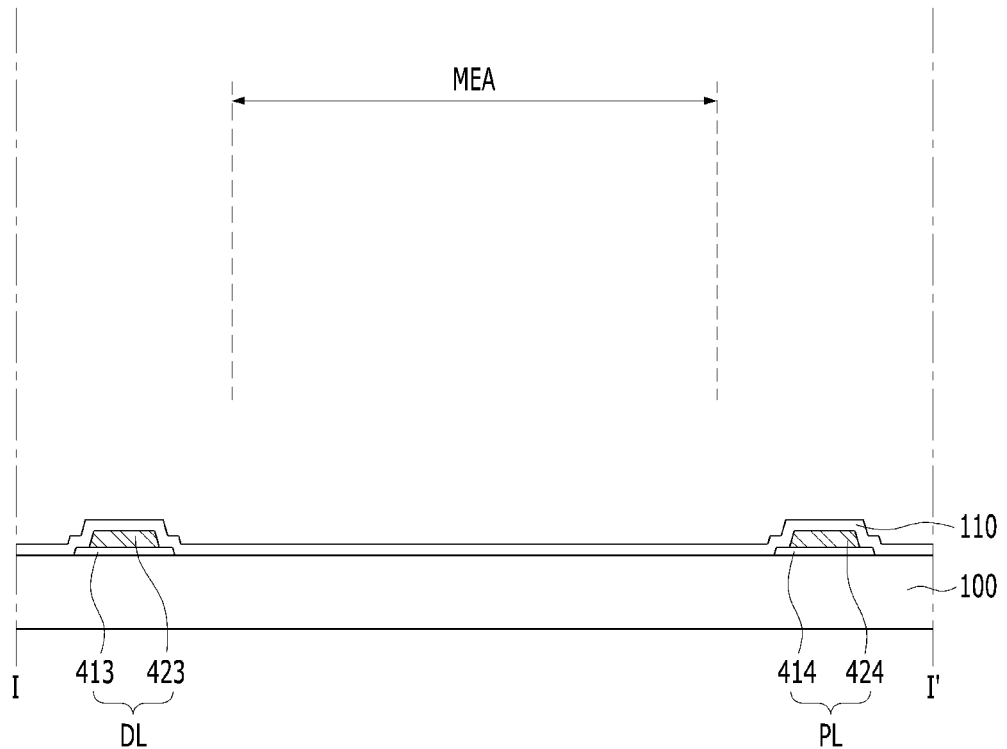
Figure 8B:
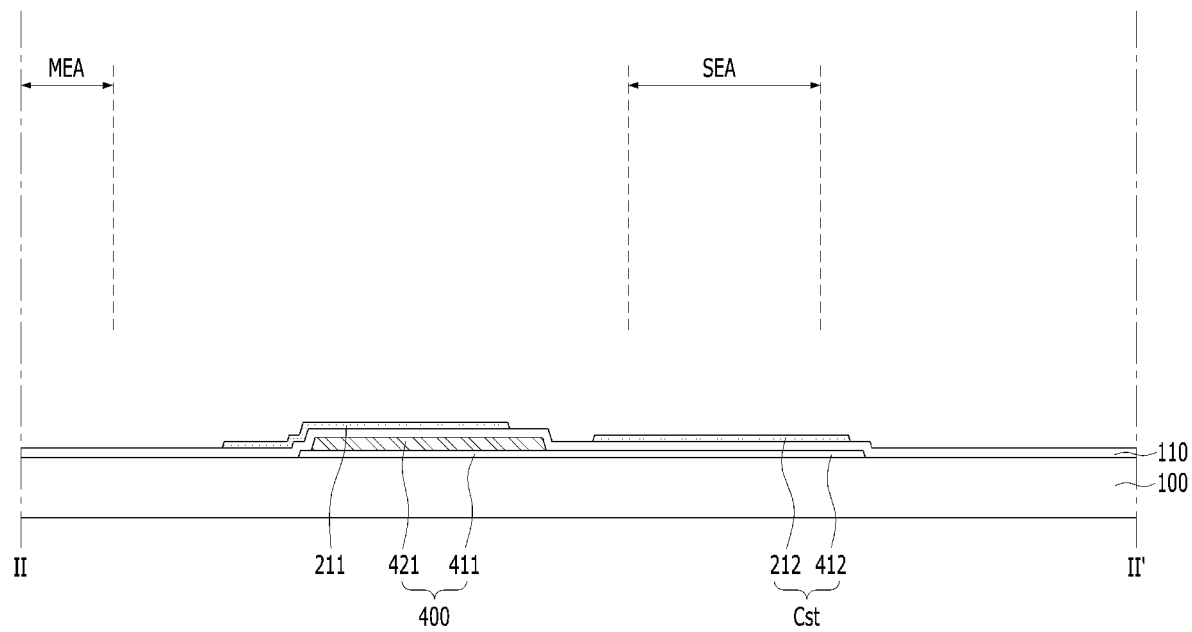

As shown in FIGS. 8A an 8B, the method of forming the display apparatus according to the aspect of the present disclosure may include a step of forming a semiconductor pattern 211 and a second capacitor electrode 212 on the buffer insulating layer 110.

The semiconductor pattern 211 may be formed of a semiconductor material. The semiconductor pattern 211 may be formed of a material having high transmittance. For example, the semiconductor pattern 211 may be formed of an oxide semiconductor using a metal oxide, such as IGZO. A portion of the semiconductor pattern 211 may be formed on the light-blocking pattern 400. For example, the semiconductor pattern 211 may include a channel region between a source region and a drain region, wherein the channel region of the semiconductor pattern 211 may overlap the light-blocking pattern 400.

The second capacitor electrode 212 may be formed of a conductive material. The second capacitor electrode 212 may be formed of a material having high transmittance. For example, the second capacitor electrode 212 may be formed of a metal oxide. The second capacitor electrode 212 may be formed of the same material as the semiconductor pattern 211. For example, the step of forming the semiconductor pattern 211 and the second capacitor electrode 212 may include a step of forming an oxide semiconductor layer on the buffer insulating layer 110 by depositing a metal oxide such as IGZO, and a step of patterning the oxide semiconductor layer.

The channel region may have an electric conductivity lower than the source region and the drain region. The second capacitor electrode 212 may have a resistance lower than the channel region of the semiconductor pattern. For example, the step of forming the semiconductor pattern 211 and the second capacitor electrode 212 may include a step of conductorizing a portion of the oxide semiconductor. The source region and the drain region of the semiconductor pattern 211 and the second capacitor electrode 212 may include a conductorized region of the oxide semiconductor.

The second capacitor electrode 212 may be formed on a portion of the first capacitor electrode 412. For example, the stacked structure of the first capacitor electrode 412 and the second capacitor electrode 212 may constitute a storage capacitor Cst.

Figure 9A:
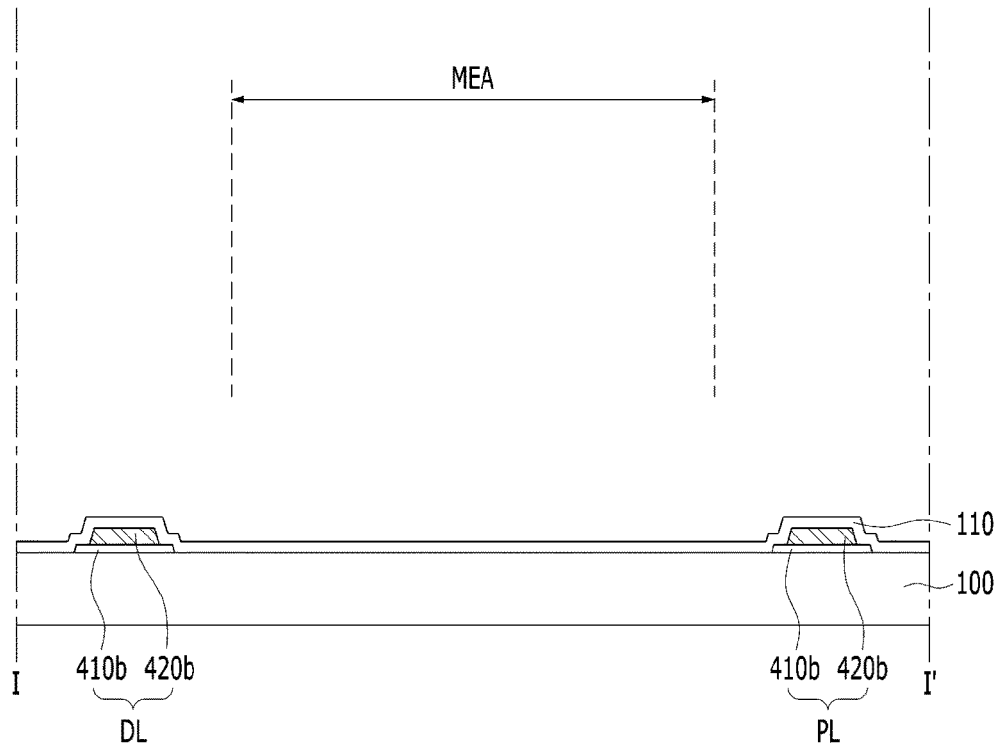
Figure 9B:
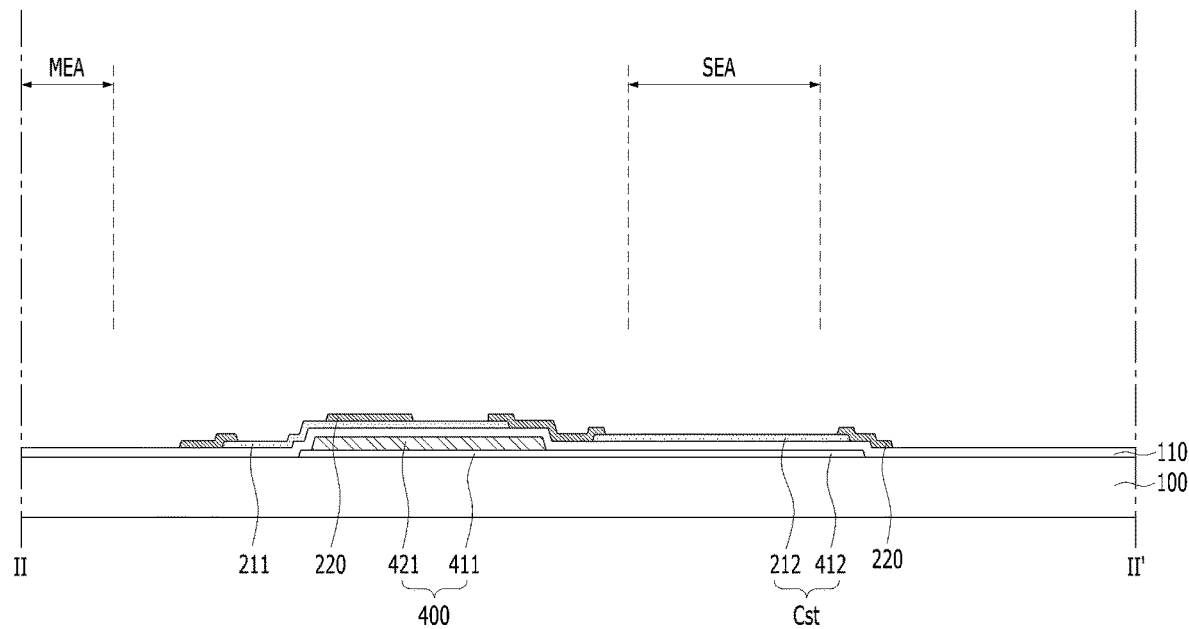

As shown in FIGS. 9A and 9B, the method of forming the display apparatus according to the aspect of the present disclosure may include a step of forming a gate insulating layer 220 on the device substrate 100 in which the semiconductor pattern 211 and the storage capacitor Cst are formed.

The gate insulating layer 220 may be disposed on the channel region of the semiconductor pattern 211. An edge of the semiconductor pattern 211 and an edge of the second capacitor electrode 212 may be covered by the gate insulating layer 220. The gate insulating layer 220 may partially expose the source region and the drain region of the semiconductor pattern 211. For example, the step of forming the gate insulating layer 220 may include a step of forming gate insulating material layer on the device substrate 100 in which the storage capacitor Cst is formed, and a step of patterning the gate insulating material layer.

The gate insulating layer 220 may be formed of an insulating material. For example, the gate insulating layer 220 may be formed of silicon oxide (SiO), silicon nitride (SiN) and/or a High-K material having high dielectric constant. The gate insulating layer 220 may be formed in a multi-layer structure.

Figure 10A:
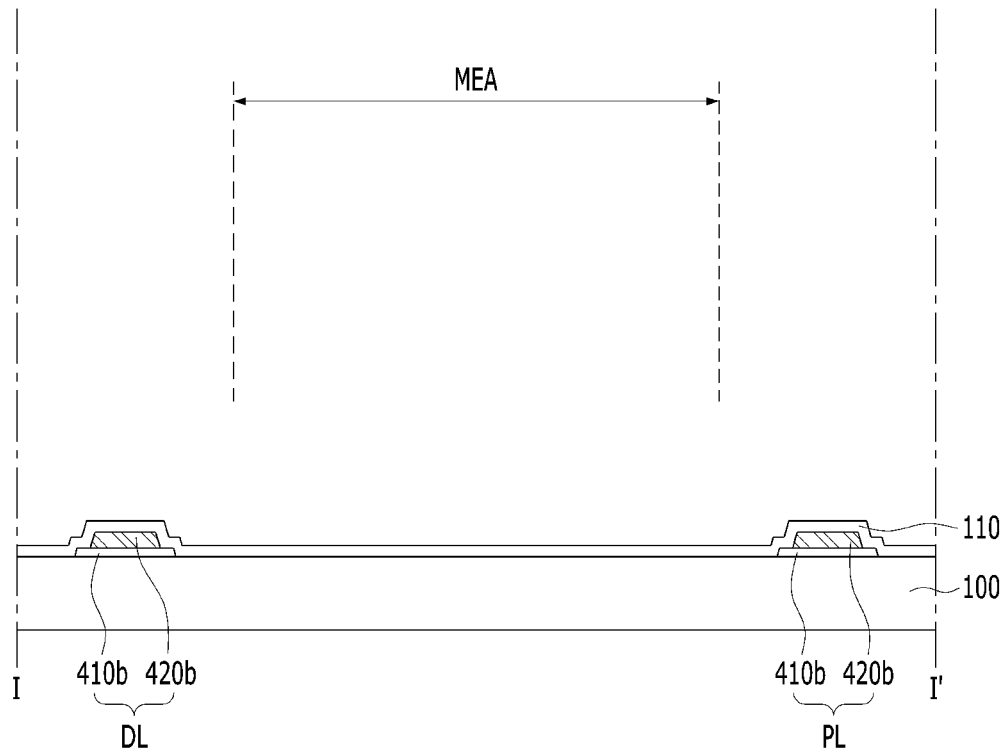
Figure 10B:
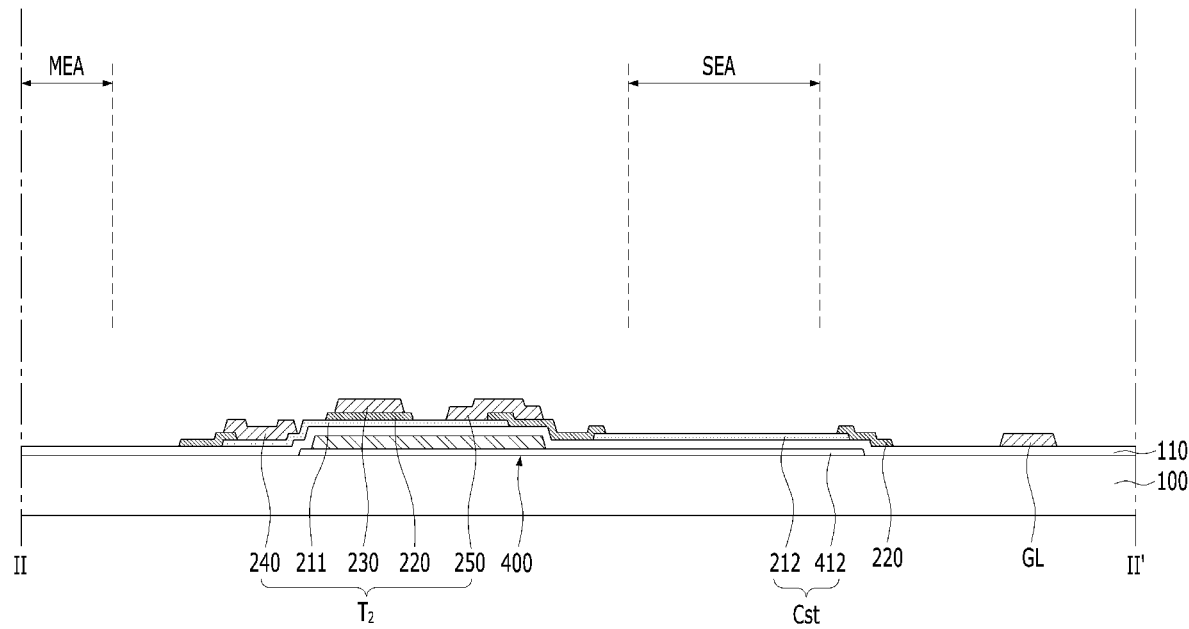

As shown in FIGS. 10A and 10B, the method of forming the display apparatus according to the aspect of the present disclosure may include a step of forming a thin film transistor $T_2$ and a gate line GL on the device substrate 100.

The step of forming the thin film transistor $T_2$ may include a step of forming a gate electrode 230, a source electrode 240 and a drain electrode 250 on the device substrate 100 in which the gate insulating layer 220 is formed.

The gate electrode 230, the source electrode 240 and the drain electrode 250 may be formed of a conductive material. The gate electrode 230 may overlap the channel region of the semiconductor pattern 211. The source electrode 240 may be connected to a portion of the source region of the semiconductor pattern 211 exposed by the gate insulating layer 220. The drain electrode 250 may be connected to a portion of the drain region of the semiconductor pattern 211 exposed by the gate insulating layer 220.

The gate electrode 230, the source electrode 240 and the drain electrode 250 may be formed, simultaneously. For example, the step of forming the thin film transistor $T_2$ may include a step of forming a conductive material layer on the gate insulating layer 220, and a step of patterning the conductive material layer.

The gate line GL may be formed of a conductive material. The gate line GL may be formed of the same material as the gate electrode 230. For example, the gate line GL may be formed simultaneously with the gate electrode 230, the source electrode 240 and the drain electrode 250.

Figure 11A:
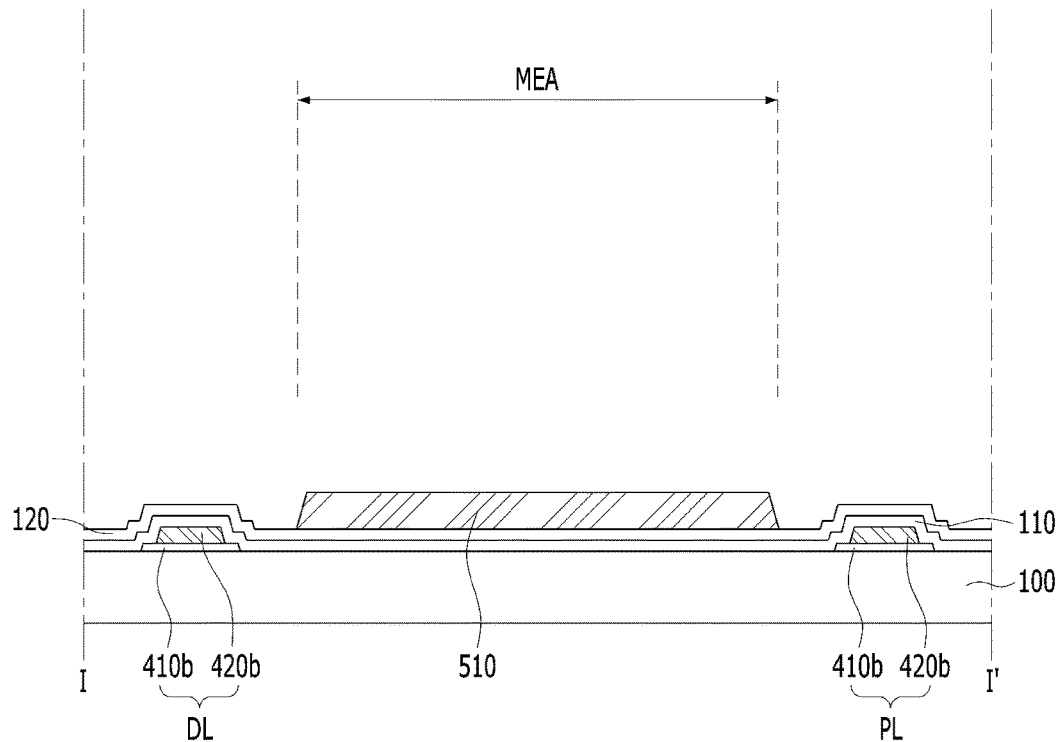
Figure 11B:
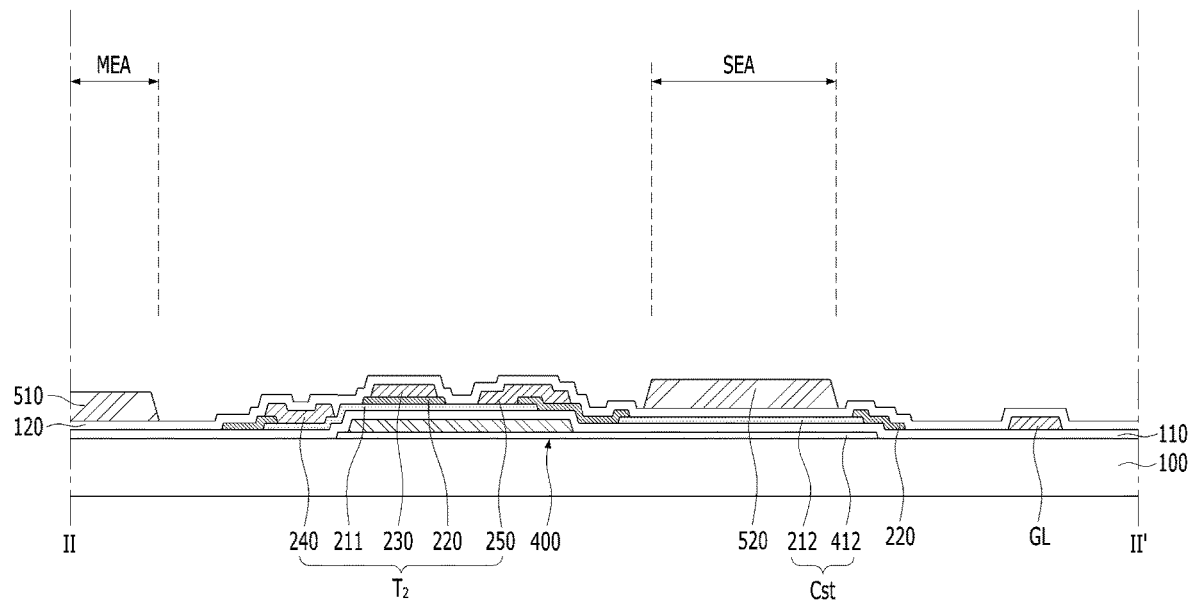

As shown in FIGS. 11A and 11B, the method of forming the display apparatus according to the aspect of the present disclosure may include a step of forming a lower passivation layer 120 on the device substrate 100 in which the thin film transistor $T_2$ and the gate line GL are formed, and a step of forming a color filter 510 and 520 on the lower passivation layer 120.

The lower passivation layer 120 may be formed of an insulating material. For example, the step of forming the lower passivation layer 120 may include a step of depositing silicon nitride (SiN) on the device substrate 100 in which the thin film transistor $T_2$ and the gate line GL are formed.

The color filter may include a first color filter 510 overlapping with the main-emission region MEA which is to be defined by a subsequent process, and a second color filter 520 overlapping with the sub-emission region SEA which is to be defined by a subsequent process. For example, the first color filter 510 may be formed outside the thin film transistor $T_2$ and the storage capacitor Cst, and the second color filter 520 may be formed on the storage capacitor Cst. The second color filter 520 may be formed of the same material as the first color filter 510. The second color filter 520 may be formed simultaneously with the first color filter 510. For example, the step of forming the color filter 510 and 520 may include a step of forming a color filter material layer on the lower passivation layer 120, and a step of forming the first color filter 510 and the second color filter 520 by pattering the color filter material layer.

Figure 12A:
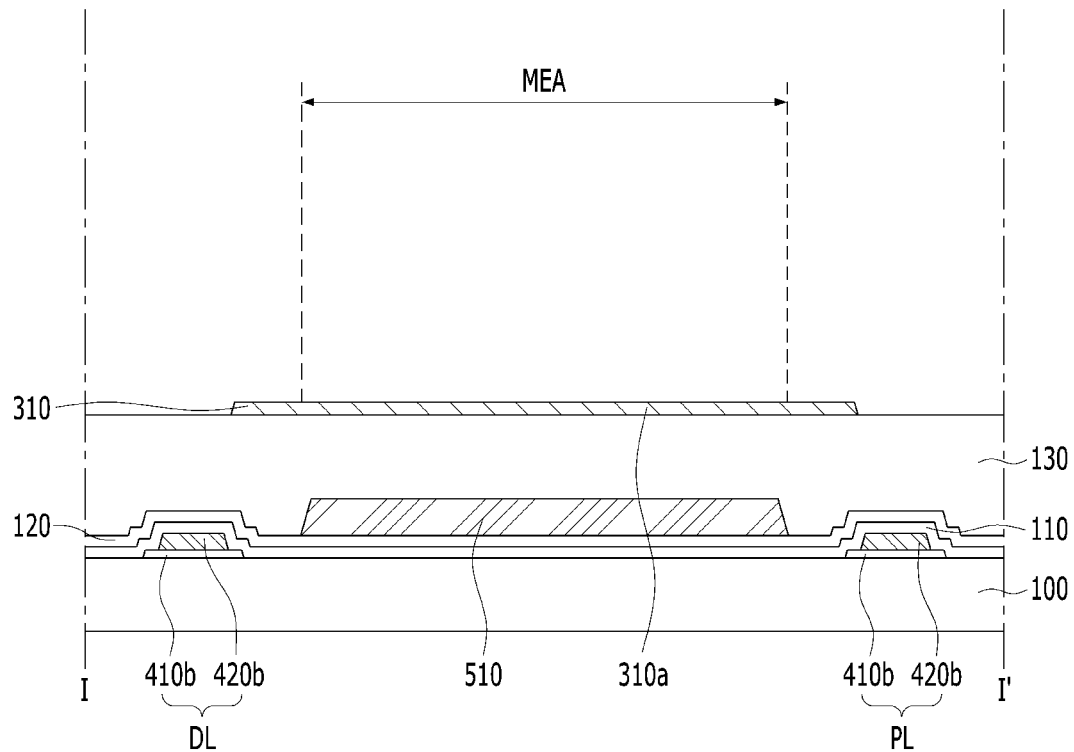
Figure 12B:
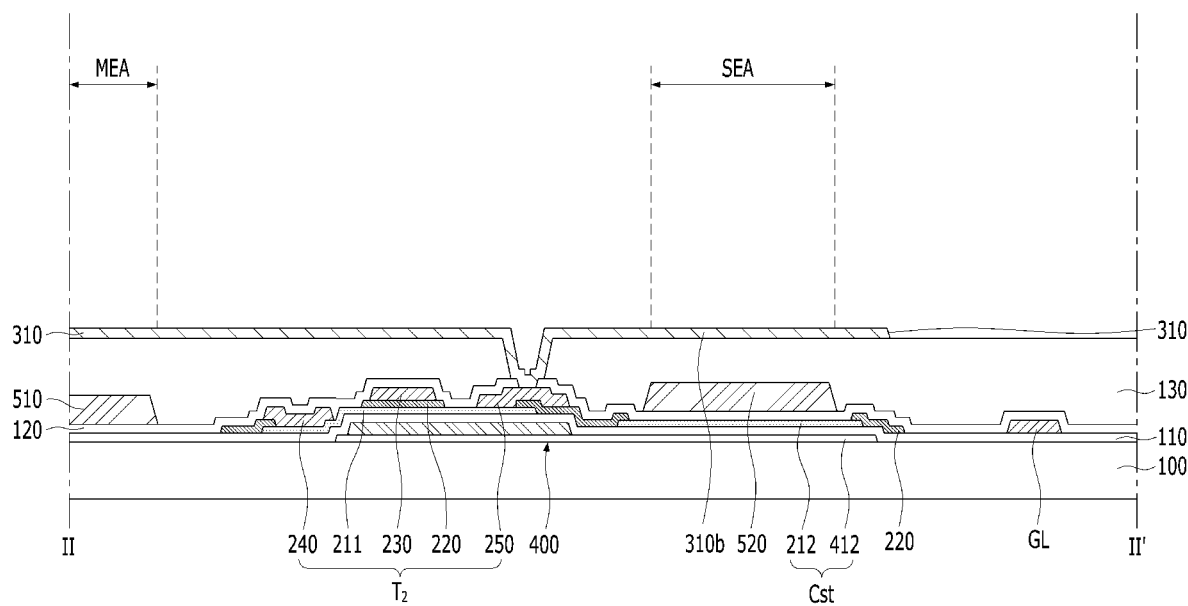

As shown in FIGS. 12A and 12B, the method of forming the display apparatus according to the aspect of the present disclosure may include a step of forming an over-coat layer 130 on the device substrate 100 in which the color filter 510 and 520 is formed, and a step of forming a first emission electrode 310 on the over-coat layer 130.

The over-coat layer 130 may be formed of an insulating material. The over-coat layer 130 may be formed of a material different from the lower passivation layer 120. The over-coat layer 130 may remove a thickness difference due to the thin film transistor $T_2$, the first color filter 510 and the second color filter 520. For example, the over-coat layer 130 may be formed of an organic insulating material.

The first emission electrode 310 may be formed of a conductive material. The first emission electrode 310 may be formed of a material having high transmittance. For example, the first emission electrode 310 may be a transparent electrode formed of a metal oxide, such as ITO and IZO.

The first emission electrode 310 may be electrically connected to the drain electrode 250 of the thin film transistor $T_2$. For example, the step of forming the first emission electrode 310 may include a step of forming an electrode contact hole partially exposing the drain electrode 250 of the thin film transistor $T_2$, a step of forming an emission electrode layer by depositing a conductive material having high transmittance on the device substrate 100 in which the electrode contact hole is formed, and a step of patterning the emission electrode layer.

The first emission electrode 310 may extend beyond the thin film transistor $T_2$. For example, the first emission electrode 310 may include a first electrode region 310a overlapping with the first color filter 510, and a second electrode region 310b overlapping with the storage capacitor Cst and the second color filter 520.

Figure 13A:
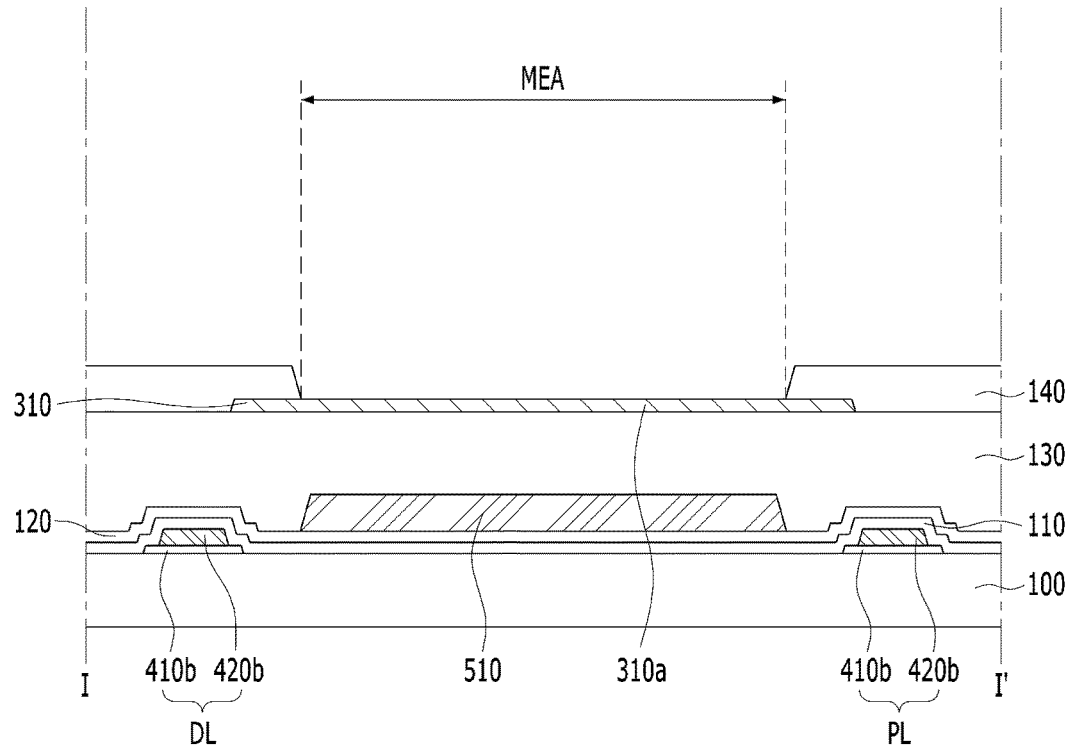
Figure 13B:
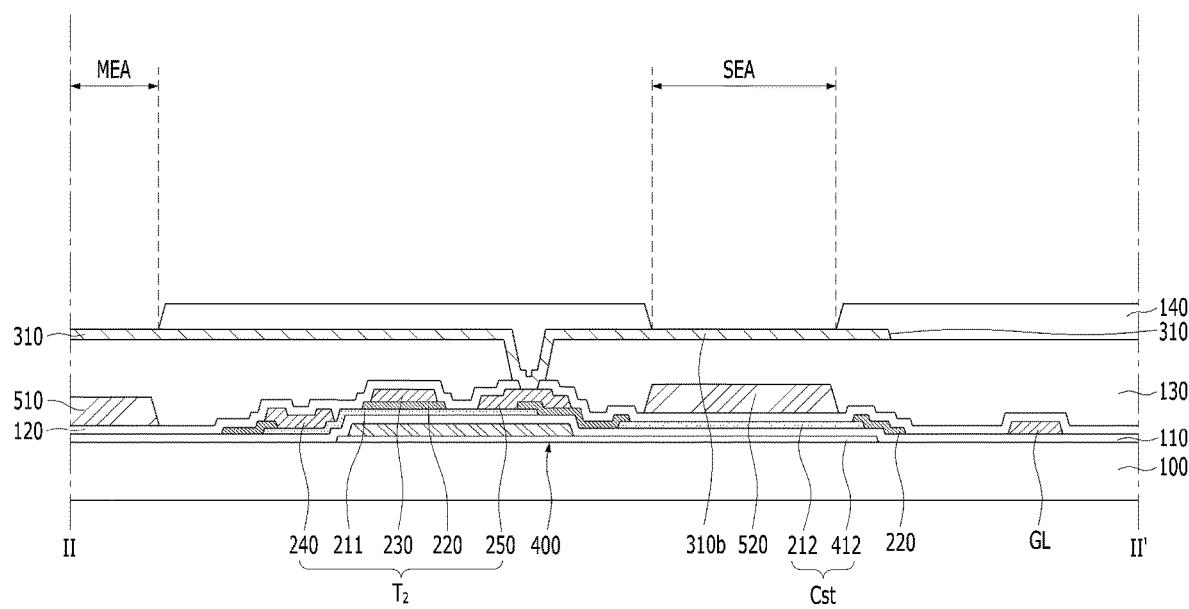

As shown in FIGS. 13A and 13B, the method of forming the display apparatus according to the aspect of the present disclosure may include a step of forming a bank insulating layer 140 on the device substrate 100 in which the first emission electrode 310 is formed.

The bank insulating layer 140 may be formed of an insulating material. For example, the bank insulating layer 140 may be formed of an organic insulating material. The bank insulating layer 140 may be formed of a material different from the over-coat layer 130.

The bank insulating layer 140 may define the main-emission region MEA and the sub-emission region SEA. For example, the bank insulating layer 140 may expose the first electrode region 310a and the second electrode region 310b of the first emission electrode 310. The step of forming the bank insulating layer 140 may include a step of forming a bank material layer by depositing an organic insulating material on the device substrate 100 in which the first emission electrode 310 is formed, and a step of defining the main-emission region MEA and the sub-emission region SEA by patterning the bank material layer.

As shown in FIGS. 2A and 2B, the method of forming the display apparatus according to the aspect of the present disclosure may include a step of sequentially forming a light-emitting layer 320 and a second emission electrode 330 on the device substrate 100 in which the bank insulating layer 140 is formed, and a step of coupling an encapsulation substrate 700 to the device substrate 100 in which the second emission electrode 330 is formed using an encapsulating layer 600.

Accordingly, the method of forming the display apparatus according to the aspect of the present disclosure may form the transparent storage capacitor Cst using a process of forming the light-blocking pattern 400 and a process of forming the thin film transistor $T_2$. Thus, in the method of forming the display apparatus according to the aspect of the present disclosure, effective emission region of each pixel area PA may be increased without decreasing process efficiency. Therefore, in the method of forming the display apparatus according to the aspect of the present disclosure, the quality of the image realized on an outer surface of the device substrate 100 may be effectively improved.

Figure 14:
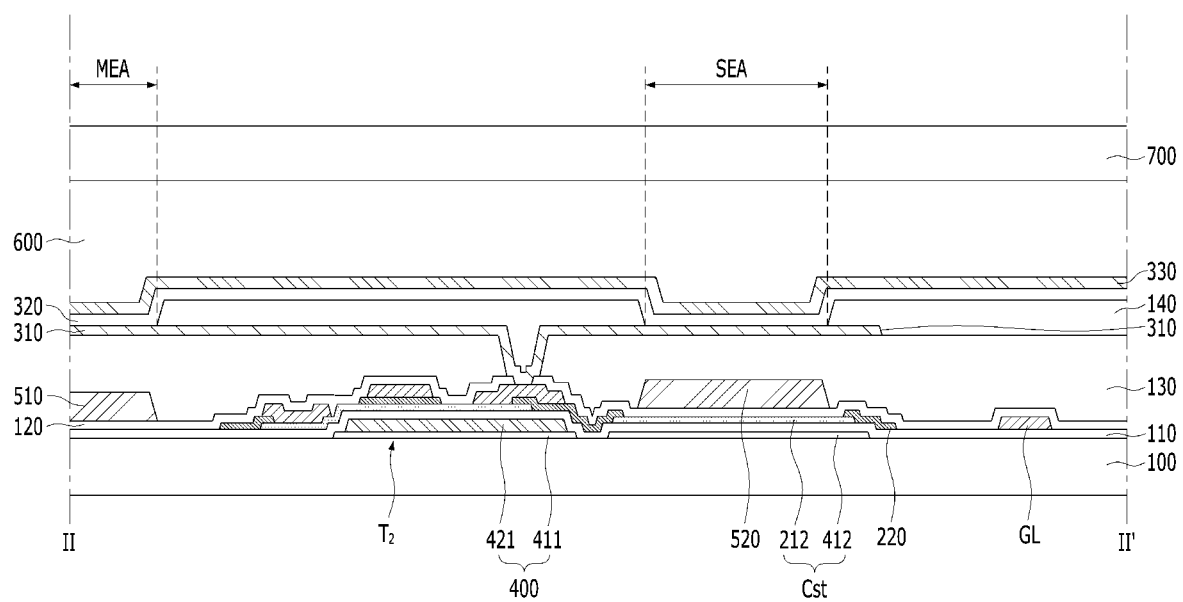
FIGS. 14 to 20 are views showing the display apparatus according to another aspect of the present disclosure.

The display apparatus according to the aspect of the present disclosure is described that the first capacitor electrode 412 is formed simultaneously with the first blocking layer 411 of the light-blocking pattern 400. However, the display apparatus according to another aspect of the present disclosure may include the light-blocking pattern 400 separated from the storage capacitor Cst. For example, in the display apparatus according to another aspect of the present disclosure, the first capacitor electrode 412 of the storage capacitor Cst may be spaced away from the first blocking layer 411 of the light-blocking pattern 400, as shown in FIG. 14. Thus, in the display apparatus according to another aspect of the present disclosure, a degree of freedom in the configuration of the storage capacitor Cst and the light-blocking pattern 400 may be improved. For example, in the display apparatus according to another aspect of the present disclosure, transparency of the storage capacitor Cst may be improved, regardless of the configuration of the light-blocking pattern 400.

Figure 15A:
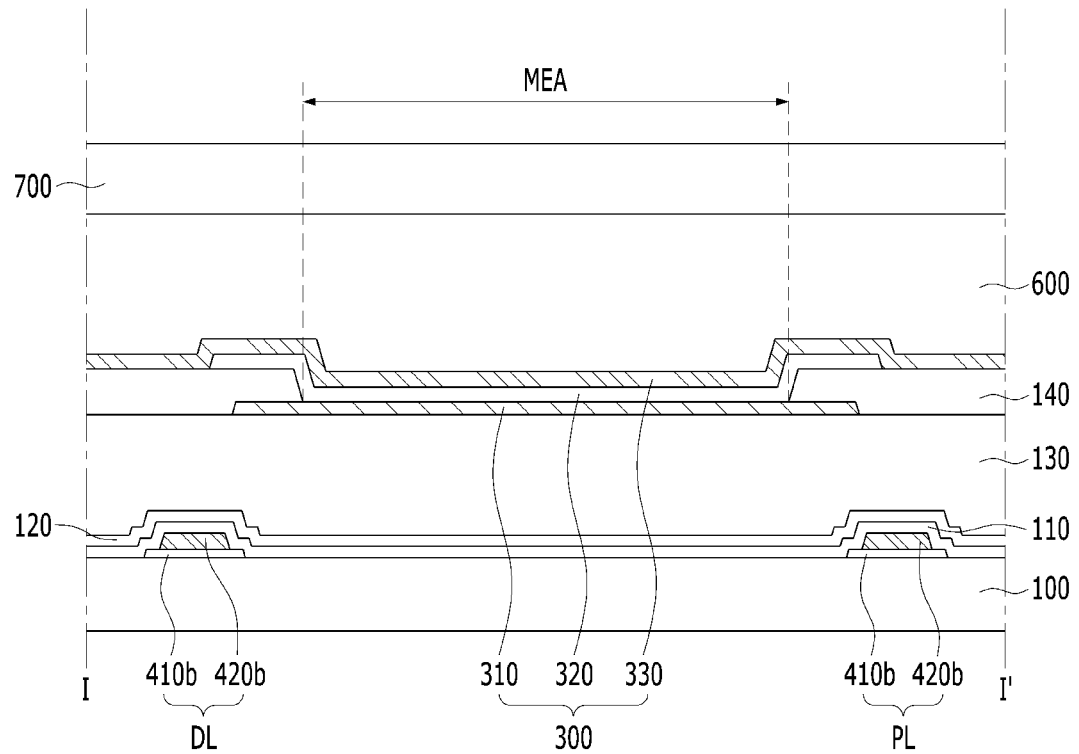
Figure 15B:
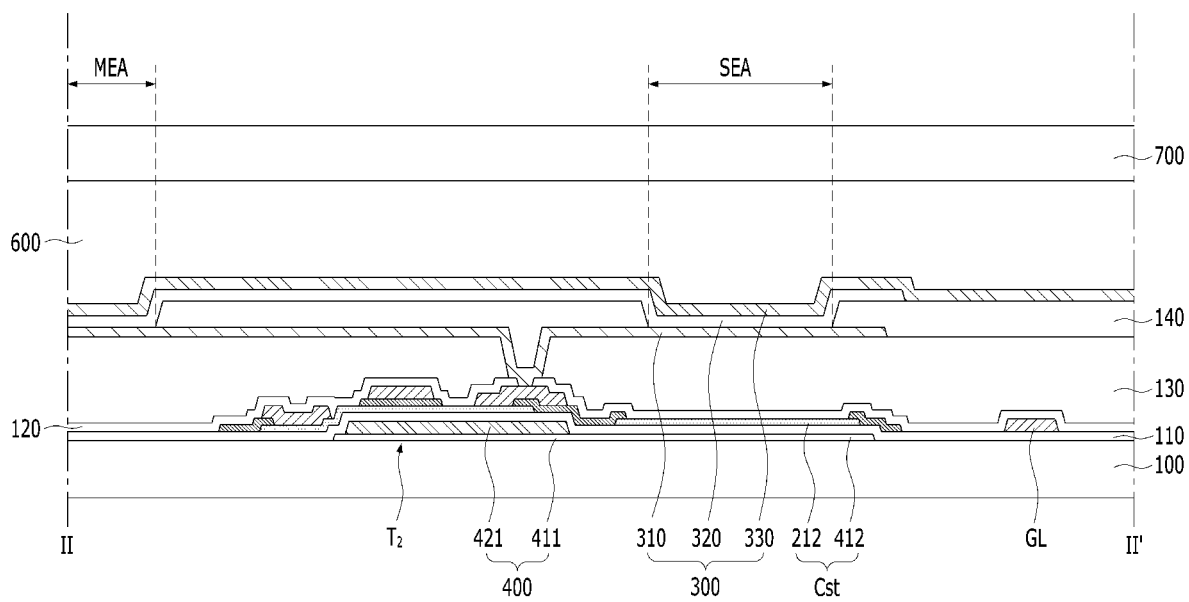

The display apparatus according to the aspect of the present disclosure is described that each of the pixel areas PA realizes a specific color using the color filter 510 and 520. However, in the display apparatus according to another aspect of the present disclosure, the color filter 510 and 520 may be not formed in each pixel area PA. For example, in the display apparatus according to another aspect of the present disclosure, the light-emitting layer 320 of each pixel area PA may be formed by a deposition process using a fine metal mask (FMM). Thus, in the display apparatus according to another aspect of the present disclosure, the light-emitting layer 320 of each pixel area PA may include an end disposed outside the main-emission region MEA and the sub-emission region SEA of the corresponding pixel area PA, as shown in FIGS. 15A and 15B. That is, in the display apparatus according to another aspect of the present disclosure, the light-emitting layer 320 of each pixel area PA may generate the light displaying a color different from each other.

Figure 16:
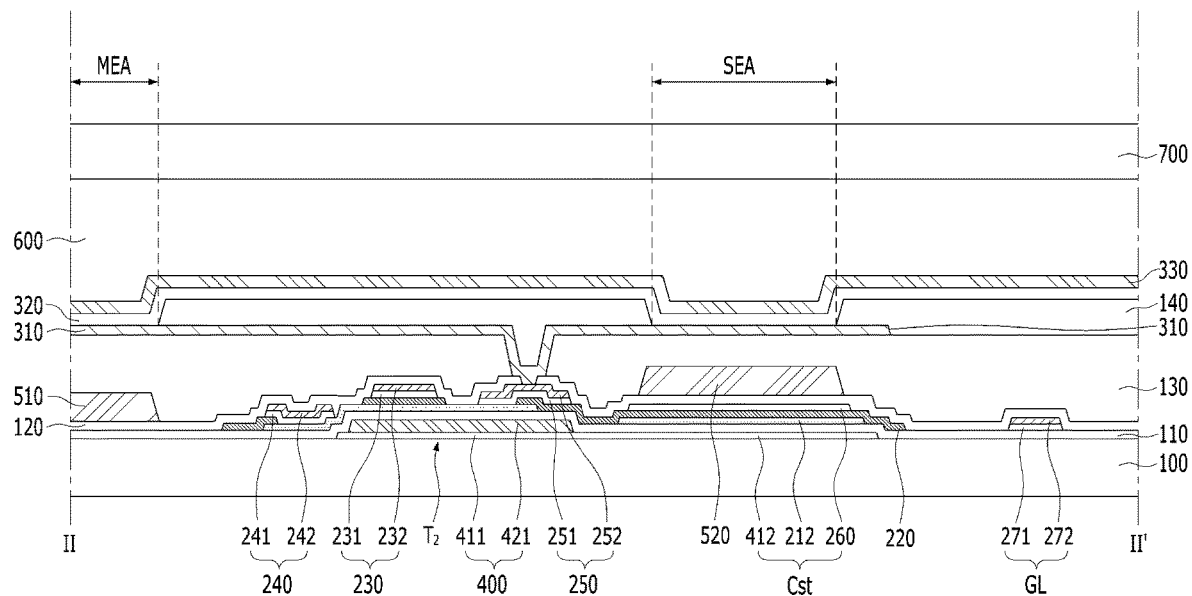

The display apparatus according to the aspect of the present disclosure is described that the storage capacitor Cst is constituted by stacking the first capacitor electrode 412 and the second capacitor electrode 212. However, in the display apparatus according to another aspect of the present disclosure, the storage capacitor Cst may include at least three capacitor electrode. For example, in the display apparatus according to another aspect of the present disclosure, the storage capacitor Cst may include a first capacitor electrode 412, a second capacitor electrode 212 and a third capacitor electrode 260, which are sequentially stacked between the device substrate 100 and the second color filter 520, as shown in FIG. 16. The buffer insulating layer 110 may be disposed between the first capacitor electrode 412 and the second capacitor electrode 212. The third capacitor electrode 260 may be spaced away from the second capacitor electrode 212. For example, the gate insulating layer 220 of the thin film transistor $T_2$ may extend between the second capacitor electrode 212 and the third capacitor electrode 260. The third capacitor electrode 260 may be insulated from the second capacitor electrode 212 by the gate insulating layer 220 of the thin film transistor $T_2$.

The third capacitor electrode 260 may include a conductive material. The third capacitor electrode 260 may have a transmittance higher than the second emission electrode 330. For example, the third capacitor electrode 260 may include a metal oxide. Thus, in the display apparatus according to another aspect of the present disclosure, a capacitance of the storage capacitor may be sufficiently secured.

The gate electrode 230, the source electrode 240 and the drain electrode 250 of the thin film transistor $T_2$ may have a double layer structure. For example, the gate electrode 230 may have a stacked structure of a first gate conductive layer 231 and a second gate conductive layer 232, the source electrode 240 may have a stacked structure of a first source conductive layer 241 and a second source conductive layer 242, and the drain electrode 250 may have a stacked structure of a first drain conductive layer 251 and a second drain conductive layer 252.

The first gate conductive layer 231 and the second gate conductive layer 232 may include a conductive material. The first gate conductive layer 231 may include a material having high adhesion to the gate insulating layer 220. The first gate conductive layer 231 may include a transparent material. For example, the first gate conductive layer 231 may be a transparent electrode formed of a metal oxide, such as ITO and IZO. The first source conductive layer 241 and the first drain conductive layer 251 may include the same material as the first gate conductive layer 231. The second gate conductive layer 232 may include a material having a resistance lower than the first gate conductive layer 231. For example, the second gate conductive layer 232 may include a metal, such as aluminum (Al), chromium (Cr), copper (Cu), molybdenum (Mo), titanium (Ti) and tungsten (W). The second source conductive layer 242 and the second drain conductive layer 252 may include the same material as the second gate conductive layer 232.

The third capacitor electrode 260 may include the same material as the first gate conductive layer 231. For example, the third capacitor electrode 260 may be formed by using a process of forming the gate electrode 230, the source electrode 240 and the drain electrode 250. That is, in the display apparatus according to another aspect of the present disclosure, a capacitance of the storage capacitor may be sufficiently secured by using a process of forming the thin film transistor $T_2$. Thus, in the display apparatus according to another aspect of the present disclosure, the process efficiency and the quality of the image may be improved.

Figure 17:
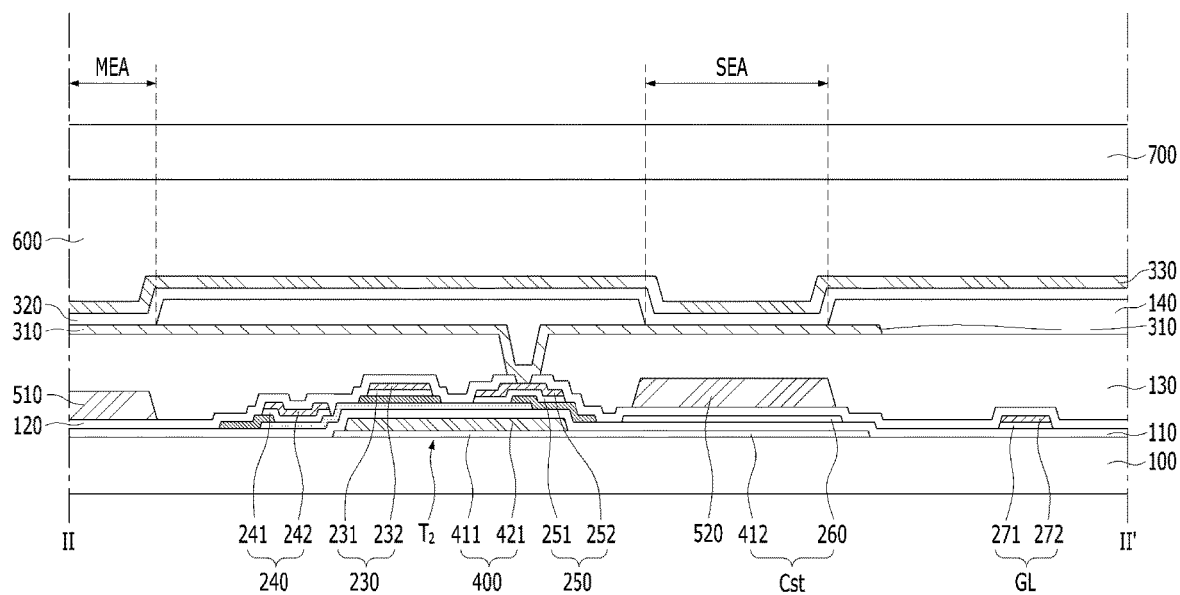

The display apparatus according to the aspect of the present disclosure is described that the second capacitor electrode 212 is formed simultaneously with the semiconductor pattern 211. However, in the display apparatus according to another aspect of the present disclosure, the second capacitor electrode may include a material different from the semiconductor pattern 211. For example, in the display apparatus according to another aspect of the present disclosure, the gate electrode 230, the source electrode 240 and the drain electrode 250 of the second thin film transistor $T_2$ may have a double layer structure, and a second capacitor electrode 260 of the storage capacitor may include the same material as the first gate conductive layer 231 of the gate electrode 230 which is disposed between the semiconductor pattern 211 and the second gate conductive layer 232 of the gate electrode 230, as shown in FIG. 17. Thus, in the display apparatus according to another aspect of the present disclosure, a degree of freedom for the material and the forming process of the semiconductor pattern 211 may be improved. And, in the display apparatus according to another aspect of the present disclosure, the transparency of the second capacitor electrode 260 may be improved. Therefore, in the display apparatus according to another aspect of the present disclosure, the quality of the image realized on the outer surface of the device substrate 100 may be effectively improved.

Figure 18:
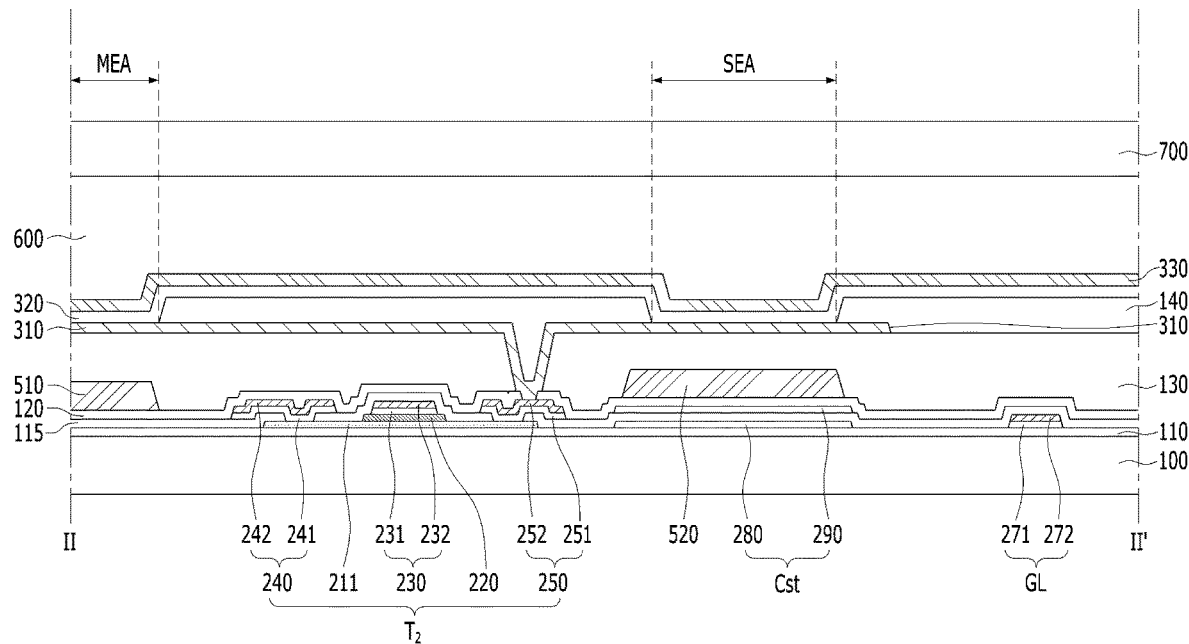

The display apparatus according to the aspect of the present disclosure is described that the source electrode 240 and the drain electrode 250 are formed simultaneously with the gate electrode 230. However, in the display apparatus according to another aspect of the present disclosure, the source electrode 240 and the drain electrode 250 of the second thin film transistor $T_2$ may be disposed on a layer different from the gate electrode 230 of the second thin film transistor $T_2$. For example, the display apparatus according to another aspect of the present disclosure may include an interlayer insulating layer 115 covering the gate electrode 230, wherein the source electrode 240 and the drain electrode 250 may be disposed on the interlayer insulating layer 115, as shown in FIG. 18. Thus, in the display apparatus according to another aspect of the present disclosure, a degree of freedom in the configuration of the driving circuit may be improved.

In the display apparatus according to another aspect of the present disclosure, the gate electrode 230, the source electrode 240 and the drain electrode 250 may have a double layer structure, respectively. For example, the gate electrode 230 may have a stacked structure of the first gate conductive layer 231 and the second gate conductive layer 232, the source electrode 240 may have a stacked structure of the first source conductive layer 241 and the second source conductive layer 242, and the drain electrode 250 may have a stacked structure of the first drain conductive layer 251 and the second drain conductive layer 252. The first gate conductive layer 231, the first source conductive layer 241 and the first drain conductive layer 251 may be a transparent electrode composed of a metal oxide, such as ITO and IZO. The second gate conductive layer 232, the second source conductive layer 242 and the second drain conductive layer 252 may include a metal, such as aluminum (Al), chromium (Cr), copper (Cu), molybdenum (Mo), titanium (Ti) and tungsten (W).

In the display apparatus according to another aspect of the present disclosure, the storage capacitor Cst may have a stacked structure of a first capacitor electrode 280 disposed on the same layer as the first gate conductive layer 231, and a second capacitor electrode 290 disposed on the same layer as the first drain conductive layer 251. The first capacitor electrode 280 may be formed simultaneously with the first gate conductive layer 231, and the second capacitor electrode 290 may be formed simultaneously with the first drain conductive layer 251. Thus, in the display apparatus according to another aspect of the present disclosure, each capacitor electrode 280 and 290 of the storage capacitor Cst may be a transparent electrode composed of a metal oxide. That is, in the display apparatus according to another aspect of the present disclosure, transparent storage capacitor Cst may be formed without forming the light-blocking pattern 400. Therefore, in the display apparatus according to another aspect of the present disclosure, the process efficiency may be improved.

Figure 19:
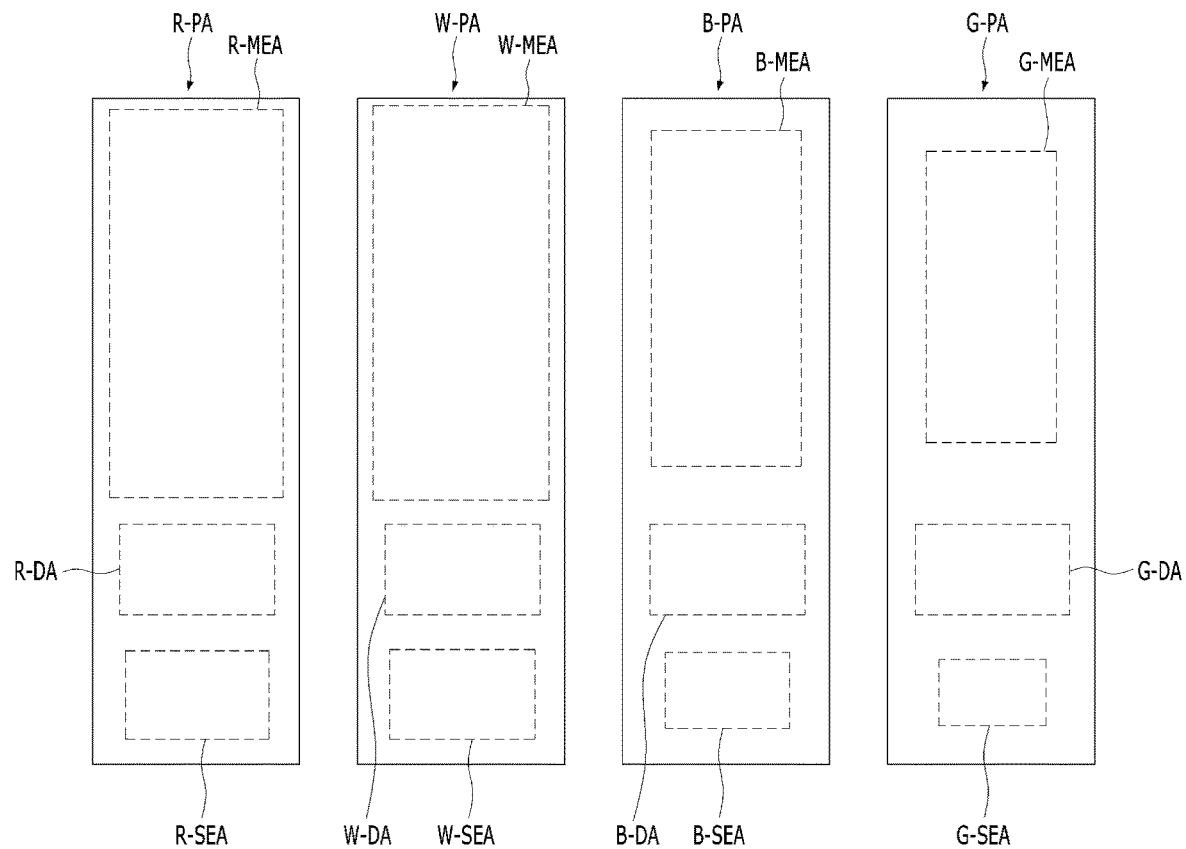
Figure 20:
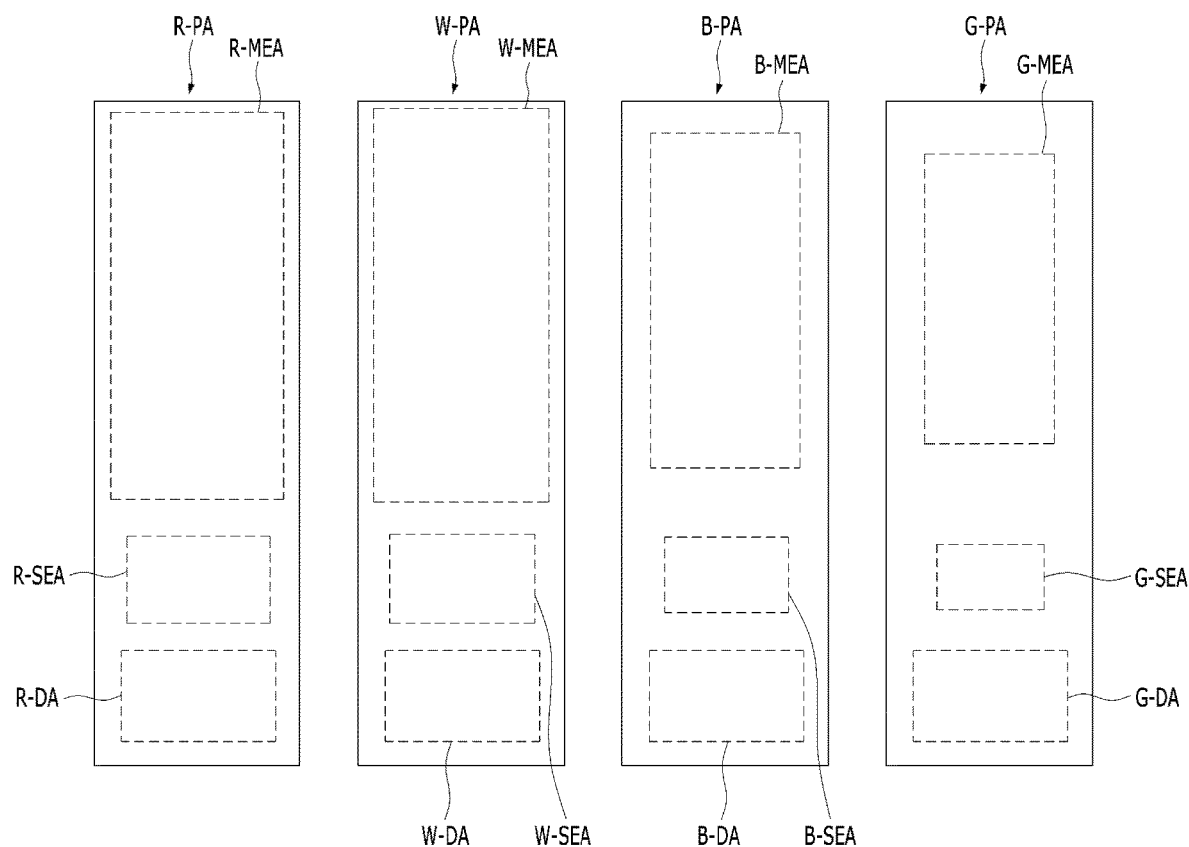

The display apparatus according to the aspect of the present disclosure is described that the sub-emission region SEA of each pixel area PA may be disposed between the first thin film transistor $T_1$ and the second thin film transistor $T_2$ of the driving circuit 200 in the corresponding pixel area PA. However, in the display apparatus according to another aspect of the present disclosure, the thin film transistor $T_1$ and $T_2$ and the storage capacitor Cst of each driving circuit 200 may be variously disposed. For example, in the display apparatus according to another aspect of the present disclosure, a driving part R-DA, W-DA, B-DA and G-DA in which the thin film transistor of each pixel area R-PA, W-PA, B-PA and G-PA is located may be disposed between the main-emission region R-MEA, W-MEA, B-MEA and G-MEA and the sub-emission region R-SEA, W-SEA, B-SEA and G-SEA of the corresponding pixel area R-PA, W-PA, B-PA and G-PA, as shown in FIG. 19. Alternatively, in the display apparatus according to another aspect of the present disclosure, the sub-emission region R-SEA, W-SEA, B-SEA and G-SEA of each pixel area R-PA, W-PA, B-PA and G-PA may be disposed between the main-emission region R-MEA, W-MEA, B-MEA and G-MEA and the driving part R-DA, W-DA, B-DA and G-DA of the corresponding pixel area R-PA, W-PA, B-PA and G-PA, as shown in FIG. 20. That is, in the display apparatus according to another aspect of the present disclosure, the driving circuit of each pixel area R-PA, W-PA, B-PA and G-PA may be freely arranged. Thus, in the display apparatus according to another aspect of the present disclosure, the sub-emission region R-SEA, W-SEA, B-SEA and G-SEA of each pixel area R-PA, W-PA, B-PA and G-PA may have a sufficient size. Therefore, in the display apparatus according to another aspect of the present disclosure, a degree of freedom for the arrangement of each pixel area R-PA, W-PA, B-PA and G-PA may be improved.

In the display apparatus according to another aspect of the present disclosure, the main-emission region and the sub-emission region of each pixel area may have a size according to a color displayed by the corresponding pixel area. For example, In the display apparatus according to another aspect of the present disclosure, a red main-emission region R-MEA of a red pixel area R-PA which emits light displaying red color may have a size different from a white main-emission region W-MEA of a white pixel area W-PA which emits light displaying white color, a blue main-emission region B-MEA of a blue pixel area B-PA which emits light displaying blue color, and a green main-emission region G-MEA of a green pixel area G-PA which emits light displaying green color. An area ratio of the main-emission region R-MEA, W-MEA, B-MEA and G-MEA and the sub-emission region R-SEA, W-SEA, B-SEA and G-SEA of each pixel area R-PA, W-PA, B-PA and G-PA may be the same. For example, an area ratio of the red main-emission region R-MEA and the red sub-emission region R-SEA of the red pixel area R-PA may be the same as an area ratio of the white main-emission region W-MEA and the white sub-emission region W-SEA of the white pixel area W-PA, an area ratio of the blue main-emission region B-MEA and the blue sub-emission region B-SEA of the blue pixel area B-PA, and an area ratio of the green main-emission region G-MEA and the green sub-emission region G-SEA of the green pixel area G-PA. Thus, in the display apparatus according to another aspect of the present disclosure, change of color coordination due to the sub-emission region R-SEA, W-SEA, B-SEA and G-SEA of each pixel area R-PA, W-PA, B-PA and G-PA may be prevented. Therefore, in the display apparatus according to another aspect of the present disclosure, the quality of the image may be effectively improved.

In the result, the display apparatus according to the aspects of the present disclosure may include the driving circuit and the light-emitting device in each pixel area, wherein the driving circuit may include a storage capacitor having a stacked structure of capacitor electrodes, wherein each of the capacitor electrodes may be a transparent electrode composed of a metal oxide having high transparency, and wherein the light-emitting device may include a region disposed outside the driving circuit and a region overlapping with the storage capacitor. Thus, in the display apparatus according to the aspects of the present disclosure, effective emission region of each pixel area which emits the light toward the device substrate supporting the driving circuit and the light emitting device of each pixel area may be increased. Thereby, in the display apparatus according to the aspects of the present disclosure, the quality of the image realized on the outer surface of the device substrate may be improved.

What is claimed is:

1. A display apparatus comprising:
    a device substrate having a first pixel area where a first main-emission region and a first sub-emission region are defined;
    a driving circuit spaced apart from the first main-emission region and including a storage capacitor overlapping with the first sub-emission region of the device substrate;
    a light-blocking pattern disposed between the device substrate and a thin film transistor of the driving circuit and including a region which overlaps with a gate electrode of the thin film transistor;
    a buffer insulating layer disposed between the light-blocking pattern and the thin film transistor and extending beyond the light-blocking pattern; and
    a light-emitting device on the first pixel area of the device substrate and electrically connected to the driving circuit,
    wherein the light-emitting device includes a first region overlapping with the first main-emission region, and a second region overlapping with the storage capacitor of the driving circuit, and
    wherein the storage capacitor has a stacked structure of metal oxide capacitor electrodes,
    wherein the light-blocking pattern has a stacked structure of a first blocking layer and a second blocking layer,
    wherein the first blocking layer between the device substrate and the second blocking layer has a higher transmittance than the second blocking layer, and wherein one of the metal oxide capacitor electrodes includes a same material as the first blocking layer.

2. The display apparatus according to claim 1, wherein the first sub-emission region has a size smaller than the first main-emission region.

3. The display apparatus according to claim 1, wherein the stacked structure of metal oxide capacitor electrodes comprise a first capacitor electrode and a second capacitor electrode, and
wherein the second capacitor electrode includes a material different from the first capacitor electrode.

4. The display apparatus according to claim 3, wherein the first capacitor electrode is a transparent electrode including one of ITO and IZO.

5. The display apparatus according to claim 1, further comprising a bank insulating layer on the device substrate and defining the first main-emission region and the first sub-emission region,
wherein the bank insulating layer defines a second main-emission region and a second sub-emission region in a second pixel area which displays a color different from the first pixel area,
wherein the second main-emission region of the second pixel area has a size different from the first main-emission region of the first pixel area, and
wherein the second sub-emission region of the second pixel area has a size different from the first sub-emission region of the first pixel area.

6. The display apparatus according to claim 1, wherein the thin film transistor is disposed outside the first main-emission region and the first sub-emission region.

7. A display apparatus comprising:
a driving circuit on a device substrate and including a storage capacitor and at least one thin film transistor;
a first emission electrode electrically connected to the driving circuit and including a first electrode region disposed outside the driving circuit and a second electrode region overlapping with the storage capacitor;
a bank insulating layer covering an edge of the first emission electrode and exposing the first electrode region and the second electrode region of the first emission electrode;
a second emission electrode disposed on the bank insulating layer and including a region overlapping with the first electrode region and a region overlapping with the second electrode region;
a light-emitting layer disposed between the first electrode region of the first emission electrode and the second emission electrode, and between the second electrode region of the first emission electrode and the second emission electrode;
a light-blocking pattern disposed between the device substrate and the thin film transistor and including a region which overlaps with a gate electrode of the thin film transistor; and
a buffer insulating layer disposed between the light-blocking pattern and the thin film transistor and extending beyond the light-blocking pattern,
wherein the storage capacitor has a stacked structure of a first capacitor electrode and a second capacitor electrode, and
wherein the light-blocking pattern has a stacked structure of a first blocking layer and a second blocking layer,
wherein the first blocking layer between the device substrate and the second blocking layer has a higher transmittance than the second blocking layer,
wherein the first emission electrode, the first capacitor electrode and the second capacitor electrode has a higher transmittance than the second emission electrode, and
wherein the first capacitor electrode includes a same material as the first blocking layer.

8. The display apparatus according to claim 7, wherein the light-emitting layer extends on a region between the first electrode region and the second electrode region of the first emission electrode, and
wherein the bank insulating layer between the first electrode region and the second electrode region is disposed between the first emission electrode and the light-emitting layer.

9. The display apparatus according to claim 7, further comprising:
a lower passivation layer on the driving circuit, the lower passivation layer overlapping with the first electrode region and the second electrode region of the first emission electrode;
a first color filter between the lower passivation layer and the first electrode region of the first emission electrode; and
a second color filter between the lower passivation layer and the second electrode region of the first emission electrode,
wherein the second color filter includes a same material as the first color filter.

10. The display apparatus according to claim 7, wherein the buffer insulating layer extends between the first capacitor electrode and the second capacitor electrode.

11. The display apparatus according to claim 7, wherein a semiconductor pattern of the thin film transistor has a transmittance higher than the second emission electrode, and
wherein the second capacitor electrode includes a same material as the semiconductor pattern.

12. The display apparatus according to claim 11, wherein the semiconductor pattern includes an oxide semiconductor.

13. The display apparatus according to claim 11, wherein the storage capacitor further includes a third capacitor electrode between the second capacitor electrode and the first emission electrode, and
wherein the third capacitor electrode has a transmittance higher than the second emission electrode.

14. The display apparatus according to claim 13, wherein a gate insulating layer of the thin film transistor extends between the second capacitor electrode and the third capacitor electrode.

15. The display apparatus according to claim 13, wherein the gate electrode of the thin film transistor has a stacked structure of a first gate conductive layer and a second gate conductive layer,
wherein the first gate conductive layer between the semiconductor pattern and the second gate conductive layer has a transmittance higher than the second gate conductive layer, and
wherein the third capacitor electrode includes a same material as the first gate conductive layer.

* * * * *